US007317232B2

(12) United States Patent
Busta

(10) Patent No.: US 7,317,232 B2
(45) Date of Patent: Jan. 8, 2008

(54) MEM SWITCHING DEVICE

(75) Inventor: Heinz H. Busta, Park Ridge, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 72 days.

(21) Appl. No.: 10/689,167

(22) Filed: Oct. 20, 2003

(65) Prior Publication Data

US 2005/0040484 A1 Feb. 24, 2005

Related U.S. Application Data

(60) Provisional application No. 60/449,994, filed on Feb. 25, 2003, provisional application No. 60/420,280, filed on Oct. 22, 2002.

(51) Int. Cl.
*H01L 29/84* (2006.01)

(52) U.S. Cl. ............... 257/415; 257/690; 257/E29.324; 438/51

(58) Field of Classification Search ................ 257/415, 257/77, 678, 420, E29.324, 690; 438/52, 438/51, 55
See application file for complete search history.

(56) References Cited

U.S. PATENT DOCUMENTS 5,589,082 A * 12/1996 Lin et al. ....................... 216/2
5,602,671 A 2/1997 Hornbeck
5,659,195 A * 8/1997 Kaiser et al. ............... 257/415
5,694,740 A 12/1997 Martin et al.
6,004,830 A 12/1999 Potter
6,025,767 A 2/2000 Kellam et al.
6,040,611 A * 3/2000 De Los Santos et al. ... 257/415
6,069,540 A * 5/2000 Berenz et al. .............. 333/101
6,100,477 A 8/2000 Randall et al.
6,109,105 A 8/2000 Kubena et al.
6,198,438 B1 3/2001 Herd et al.
6,290,859 B1 * 9/2001 Fleming et al. ................ 216/2
6,297,072 B1 * 10/2001 Tilmans et al. ............. 438/106

(Continued)

FOREIGN PATENT DOCUMENTS

GB 2365988 A * 2/2002

OTHER PUBLICATIONS

Lin et al., "Rib-reinforced micromachined beam and its applications," J. Micromech. Microeng. 10, 2000, pp. 93-99.*

(Continued)

*Primary Examiner*—B. William Baumeister
*Assistant Examiner*—Steven J. Fulk
(74) *Attorney, Agent, or Firm*—Thomas E. Omholt; Steven D. Weseman

(57) ABSTRACT

A MEM device and method for fabricating a MEM device. A MEM device comprising a lever mechanism residing along a substrate is disclosed. A contact material is deposited on a first surface of the lever mechanism. In one arrangment, the first surface is disposed towards the substrate. A first contact region may be deposited on the substrate. The first contact region attracts the lever mechanism towards the substrate such that the contact material becomes operationally coupled to a second contact region. The MEM device may also comprise a first anchor portion and a second anchor portion. The first and second anchor portions may be integral to a top surface of the substrate. Aspects of the invention are also particularly useful in providing an encapsulated MEM switching device.

11 Claims, 32 Drawing Sheets

U.S. PATENT DOCUMENTS

| | | | | |
|---|---|---|---|---|
| 6,384,353 | B1 * | 5/2002 | Huang et al. | 200/181 |
| 6,396,368 | B1 * | 5/2002 | Chow et al. | 333/262 |
| 6,465,280 | B1 * | 10/2002 | Martin et al. | 438/125 |
| 6,469,602 | B2 * | 10/2002 | Ruan et al. | 335/78 |
| 6,498,053 | B2 * | 12/2002 | Mastromatteo et al. | 438/107 |
| 6,528,887 | B2 * | 3/2003 | Daneman et al. | 257/774 |
| 6,613,601 | B1 * | 9/2003 | Krauss et al. | 438/52 |
| 6,621,022 | B1 * | 9/2003 | Ma et al. | 200/267 |
| 6,633,212 | B1 * | 10/2003 | Ruan et al. | 335/78 |
| 6,646,215 | B1 * | 11/2003 | Nelson | 200/181 |
| 6,798,029 | B2 * | 9/2004 | Volant et al. | 257/415 |
| 6,876,482 | B2 * | 4/2005 | DeReus | 359/290 |
| 6,936,902 | B2 * | 8/2005 | Reichenbach et al. | 257/415 |
| 7,008,812 | B1 * | 3/2006 | Carley | 438/52 |
| 2001/0014526 | A1 * | 8/2001 | Clevenger et al. | 438/619 |
| 2002/0008296 | A1 * | 1/2002 | Chan et al. | 257/415 |
| 2002/0047172 | A1 * | 4/2002 | Reid | 257/415 |
| 2002/0050880 | A1 * | 5/2002 | Ruan et al. | 335/78 |
| 2002/0155635 | A1 * | 10/2002 | Bifano | 438/52 |
| 2003/0143773 | A1 * | 7/2003 | Sassolini et al. | 438/51 |
| 2005/0040484 | A1 * | 2/2005 | Busta | 257/414 |

OTHER PUBLICATIONS de Boer, M.P. et al., "Tribology of MEMS," MRS Bulletin 26, Apr. 2001, pp. 302-304.

Maboudian, R., "Surface processes in MEMS technology," Surface Science Reports 30, (1998), pp. 207-269.

Zhu, X-Y et al., "Molecular Assemblies on Silicon Surfaces via Si-O Linkages," Langmuir 16, (No. 17 2000), pp. 6766-6772.

Major, R.C. et al., "Two-Step Approach to the Formation of Organic Monolayers on the Silicon Oxide Surface," Langmuir 17, (No. 18 2001), pp. 5576-5580.

Bozler, C. et al., "MEMs Microswitch Arrays for Reconfigurable Microwave Components," IEEE Antennas and Propagation Society International Symposium. Transmitting Waves of Progress to the Next Millennium, vol. 2, 2000, pp. 587-591.

Schaffner, J.H. et al., "Reconfigurable Aperture Antennas Using RF MEMS Switches for Multi-Octave Tunability and Beam Steering," IEEE Antennas and Propagation Society International Symposium. Transmitting Waves of Progress to the Next Millennium, vol. 1, 2000, pp. 321-324.

Chiao et al., "MEMS Millimeterwave Components," IEEE MTT-S International Microwave Symposium Digest, vol. 2, 1999, pp. 463-466.

Brown, E.R., "RF-MEMS Switches for Reconfigurable Integrated Circuits," IEEE Transactions on Microwave Theory and Techniques, vol. 46, No. 11, Nov. 1998, pp. 1868-1880.

Wilkerson et al., "Flip-Chip Hermetic Packaging of RF MEMS," MEMS Conference, 2001.

* cited by examiner

MEM SWITCHING DEVICE

RELATED CASES

The present patent application is related to U.S. Provisional Patent Application Ser. Nos. 60/420,280; filed on Oct. 22, 2002 and 60/449,994 filed on Feb. 22, 2003, the full disclosures of which are incorporated herein by reference.

BACKGROUND

I. Field of the Invention

The present invention is generally directed to a method and apparatus for fabricating a micro-electro-mechanical (MEM) device. More particularly, the present invention is generally directed to a method and apparatus for providing an encapsulated MEM device. Aspects of the invention are also particularly useful in providing a MEM apparatus comprising a two arm lever mechanism having increased rigidity. Such a lever mechanism may be used with a MEM switch, relay, sensor, actuator, accelerometer, and other like MEM device. Other aspects of the invention are also particularly useful in providing a MEM apparatus comprising an abrasion resistive contact that is preferably deposited along a contact area of the MEM device. However, certain aspects of the invention may be equally applicable in other scenarios as well.

II. Description of Related Technology

Micro-electro-mechanical devices (MEM devices) generally involve the integration of mechanical elements, actuators, sensors, and electronics on a common substrate. Ordinarily, such integration can occur through the use of microfabrication techniques. MEM devices can range in size from as small as a few microns to as large as a few millimeters. While the electronics that these MEM devices utilize are fabricated using Integrated Circuit (IC) process sequences (e.g., CMOS, Bipolar, or BiCMOS processes), micro-mechanical components can be fabricated using compatible "micro-machining" processes that selectively etch away portions of materials deposited on a substrate. Alternatively, the micro-machining process adds additional structural layers to form mechanical and electromechanical devices.

MEM devices bring together silicon-based microelectronics with micro-machining technology, thereby making possible the realization of a complete system-on-a-single substrate. MEM devices augment the computational ability of microelectronics with the perception and control capabilities of microsensors and/or microactuators. Examples of such electrical and mechanical combinations are gyroscopes, accelerometers, micro-motors, and sensors of micrometric size, all of which may need to be left free to move after some type of encapsulation and/or packaging. MEM devices may be used within digital to analog converters, air bag sensors, logic, memory, microcontrollers, and video controllers. Example applications of MEM devices are military electronics, commercial electronics, automotive electronics, and telecommunications.

MEM devices are essentially a technology used to create micro-miniature mechanical devices (such devices can be manufactured out of silicon or, alternatively, other materials). Ordinarily, these MEM devices are designed to respond to external stimuli. For example, where certain MEM devices are used for sensing applications, they can be fabricated so as to respond to the stimuli, and move (or actuate) mechanical structures. Known MEM technology is being applied to accelerometers in automobile airbags, pressure sensors, flow rate sensors, and other such like applications. Micro-mechanical micro arrays have also been developed for projection display applications. As will be discussed with respect to FIG. 1, MEM devices may sometimes be based on integrated circuit fabrication technologies such as those technologies similar to CMOS, with the added ability to incorporate moving and mechanical structures. Known MEM devices can typically range in size from one micron to several hundreds microns.

Certain known problems exist with existing MEM devices. MEM device are known to suffer from several types of problems. For example, one such problem involves the fabrication of MEM devices on top of a CMOS type device. An example of a known MEM device 10 is illustrated in FIG. 1. FIG. 1 illustrates a cantilever beam 12 designed over a CMOS device 16. As can be seen in FIG. 1, this MEM 10 includes a cantilevered beam 12 that generally follows the contour 14 of the underlying CMOS device 16. Therefore, the design and orientation of cantilever beam is not one that can be customized based on the specifics of the application. Rather, the cantilever beam shape will be generally dictated by the topology of the substrate layers residing underneath the cantilever beam.

In addition, with cantilevers residing over a CMOS topography, the shape of the cantilever will naturally be defined by the underlying topography of the substrate unless it is planarized before MEM fabrication. Consequently, such contoured beams will have a tendency to possess a non-uniform intrinsic stress distribution because of the device structure topography. In addition, such non-uniform cantilevers have different zero-load deflections.

One method that attempts to reduce these concerns with MEM devices designed over CMOS has been to design the substrate such that the MEM devices are located in a substrate location where no CMOS processing takes place. However, isolating these MEM devices to only a restricted substrate area can pose certain fabrication issues. One such issue relates to limiting the number of MEM devices per substrate. Isolating these MEM devices to a specific substrate area can also place certain restrictions on the applications for such a substrate.

There are other concerns arising from other known MEM devices. For example, with other known MEM devices, such devices often comprise a uniform or uni-planar cantilever beam. For example, one such known problem that arises in the fabrication of MEM devices from surface micromachining is that the cantilever does not have enough rigidity to return to the "off" position. This issue may be amplified where "stiction" occurs. Stiction usually arises when surface adhesion forces are higher than the mechanical restoring force of the micro-structure: the cantilever.

Stiction can also arise during the fabrication process. For example, when a MEM device is removed from an aqueous solution after wet etching of an underlying sacrificial layer, the liquid meniscus formed on hydrophilic surfaces can pull the microstructure towards the substrate. This pulling action results in what is known in the art as stiction.

In use, stiction may be caused by capillary forces, electrostatic attraction, and direct chemical bonding.

Another known approach to resolving the stiction issue relates to applying an anti-stiction coating to the MEM device. However, using anti-stiction coatings has other related issues. For example, these known anti-stiction coating approaches eventually degrade, particularly while the device is operating at high temperatures. In addition, certain anti-stiction coatings also have a limited service life.

MEM devices can find application as switches and relays in RF and microwave communication circuit such as transmit/receive switches, reconfigurable antennas, multiband switches, and signal routers. These types of switching devices may also find application in low frequency logic circuits. When a MEM device operates as a switch, the signal circuit is directly coupled with the activation circuit. In a MEM device operating as a relay, the two circuits are decoupled. For frequencies below about 2 GHz, the switches and relays are usually of a contact type. However, above 2 GHz, the switches and relays can be indirect switches since at these frequencies the impedance is rather small when coupling through a thin insulator layer. The impedance is given by $Z=\frac{1}{2}\pi fC$ with $f$ the frequency of the signal and C the capacitance of the swith contact.

Reliability issues often arise with such switches/relays. For example, contacts having increased reliability should be abrasion resistant. In addition, switches/relays having increased reliability should have contacts that do not deform from micro-arcs at high current densities, such as densities on the order of $1\times10^6$ A/cm$^2$. These switches/relays should also operate at currents of up to 100 milli-Amps. For example, where a MEM device has a relay contact area on the order of $20\times20$ μm$^2$ this corresponds to a current density of $2.5\times10^4$ A/cm$^2$. However, since the surface of the switch/relay contact is not entirely smooth, local current densities at certain "hot" spots can be significantly higher. Consequently, there is a general need to provide a method and apparatus for reducing such current hot spots and for providing a contact system that increases the operating reliability of the switch/relay.

Another issue that is often faced by MEM device manufacturers that affects product yields is the potential contamination of MEM devices. For example, under ordinary operation, MEM devices are often placed in operating environments that have a certain amount of air-born contaminants, such as dust. Consequently, as a result of the micron-size of typical MEM devices (and therefore the micron-size movable components of such devices), dust, various processing fluids, etchants, or other fluid and/or air-born contaminants pose a threat to the efficient operation of the MEM devices.

Another problem that may be associated with failure rates relates to MEM lever mechanism beam rigidity. Consequently, there may also be a general need for a MEM device having increased rigidity. Based in part on these forgoing issues, there is, therefore, a general need to be able to increase the production yield of MEM devices deposited on a substrate. There is also a general need to reduce the amount of contamination that a MEM device may experience, either during device design, device fabrication, device operation, device packaging, or otherwise. There is also a general need to decrease the failure rate of a MEM device caused in part by contamination, stiction, or other operating concerns. These and other general needs should also be met while fabricating a MEM device having uniform mechanical lever stress for switching purposes.

SUMMARY

According to one exemplary arrangement, a MEM device includes a lever mechanism residing along a substrate. A contact material is deposited on a first surface of the lever mechanism. The first surface is disposed towards the substrate. A first contact region is deposited on the substrate. The first contact region is energized to thereby attract the lever mechanism towards the substrate such that the contact material becomes electrically coupled to a second contact region.

According to another exemplary arrangement, a method of fabricating a MEM device is provided. This method comprises the steps of providing a lever mechanism along a substrate. The lever mechanism is provided with a first contact material, the first contact material provided along a surface of the lever mechanism. A first contact layer is provided on the substrate, the first contact layer capable of being energized so as to attract the lever mechanism towards the substrate.

These as well as other advantages of various aspects of applicant's present arrangements will become apparent to those of ordinary skill in the art by reading the following detailed description, with appropriate reference to the accompanying drawings.

BRIEF DESCRIPTION OF THE DRAWINGS

Exemplary arrangements described herein with reference to the drawings, in which:

FIG. 14(*b*) illustrates a profile view of a portion of a two arm lever mechanism anchor fabricated according to one aspect of the present invention;

DETAILED DESCRIPTION

1. Overview

Figure 1:
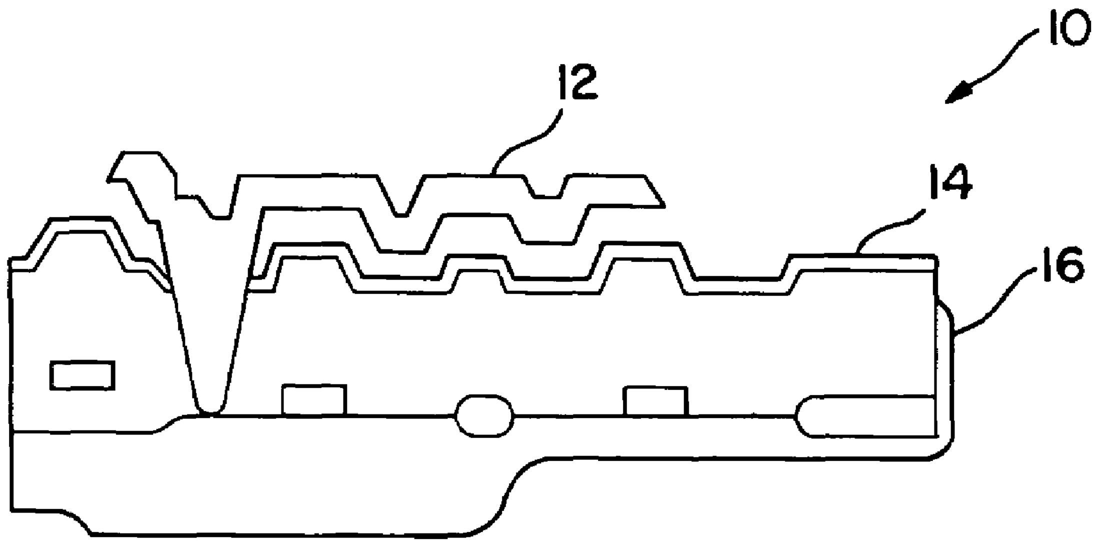
FIG. 1 illustrates a known cantilevered CMOS MEM device.

One known MEM device 10 is illustrated FIG. 1. MEM device 10 has been manufactured over a CMOS device. As can be seen from FIG. 1, the MEM device 10 includes a cantilever 12 that resides or is positioned over a substrate 16. The substrate 16 has a top surface and this top surface has a contour or topology that is dictated by CMOS manufacturing. As a result, the cantilever 12 does not have a uni-planar shape. Rather, the cantilever topology or contour 18 resembles the contour of the underlying substrate 16.

MEM cantilevers, aside from MEM CMOS devices, are also generally known. For example, MEM cantilevers are typically fabricated so that they are uniform. That is, the cantilever beam will be fabricated such that the beam will have a constant width for the entire length of the beam.

Figure 2:
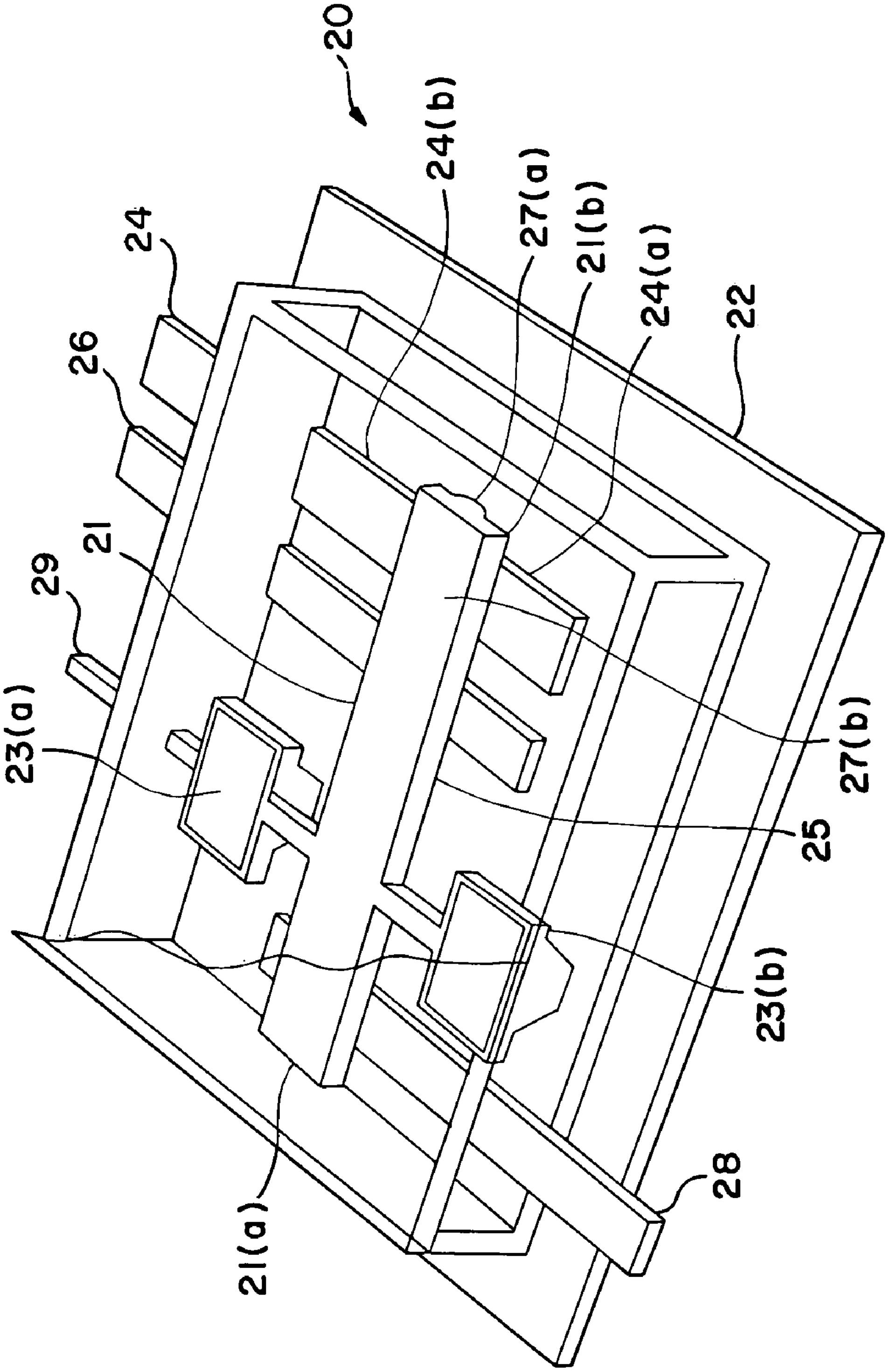
FIG. 2 provides a perspective view of a MEM device fabricated according to one aspect of the present invention.

FIG. 2 illustrates a perspective view of an integral MEM enclosure 20 fabricated in accordance with one aspect of the present invention. MEM enclosure 20 provides protection to a MEM device 25 that resides internally to enclosure 20. MEM device 25 comprises a two arm lever mechanism 21. This lever mechanism has a first anchor portion 23(*a*) and a second anchor portion 23(*b*). Both of these anchor portions 23(*a*) and (*b*) are positioned along a top surface of a substrate 22 and anchored to this substrate 22. Apart from the anchor portions 23(*a*) and (*b*), the remainder of the two arm lever mechanism extends along the surface of substrate 22 over various contact regions. Preferably, the remainder of the two arm lever mechanism comprises a first extending portion 21(*a*) and a second extending portion 21(*b*) and both of these portions extend away from the anchor portions 23(*a*) and (*b*) while also residing over a plurality of contact regions. More specifically, first extending portion 21(*a*) extends over contact region 28 and second extending portion 21(*b*) extends over contact region 26 and contact region 24.

In the arrangement provided in FIG. 2, the lever mechanism 21 resides over a pull-in contact region 26, a switching contact region 24, and a pull-back contact region 28. As can be seen from FIG. 2, these contact regions extend along the substrate surface, and eventually exit the integral enclosure 20. The two arm lever mechanism also includes common contact 29 which functions as a common reference for the pull-in and pull-out contact regions as well as part of the switch. Alternatively, a pull-out contact region could also be deposited on top of enclosure 20.

As can be seen from this perspective view given in FIG. 2, the two arm lever mechanism does not have a topography of the illustrated MEM CMOS device 10 illustrated in FIG. 1. Rather, the MEM device 20 has a lever mechanism that has a top surface that is essentially uni-planar. In other words, the contour of the top surface of the lever mechanism 21 is not dictated by the underlying substrate topography. As will be described in further detail below, the lever mechanism 21 also has a bottom surface that is preferably not uni-planar but rather contains a structure that tends to increase lever mechanism rigidity. For example, in one arrangement, the lever mechanism 21 is provided with a contoured surface such as the ribbed surface 27(*a*). In such an arrangement, the contoured surface can comprise a metallic layer which extends the length of the lever mechanism.

Alternatively, the lever mechanism may be provided with a metallic contact region. Such a metallic contact could be deposited along an end of the first portion of the lever mechanism, preferably near the switch contact region. Similarly, a metallic contact region could be provided along an end of the second portion of the lever mechanism, preferably near the second contact region.

The pull-in contact region 26 functions by applying an electric field between the lever structure and the pull-in contact that drive the lever structure and the contact region 26 together. An anchor lever mechanism arm 29 allows a potential voltage to be applied to the lever mechanism 21. The pull-out contact region 28, in this arrangement located at an opposite end of the lever mechanism as the pull-in contact region 26, functions to separate the switching function, either to turn off the device or in the event of a false turn-on. Such a false turn-on could arise due to stiction or MEM device contamination as previously discussed herein.

The contact region 24 comprises two micro-strip lines 24(*a*) and (*b*) wherein these strip lines are separated by a gap. This gap resides under the lever mechanism and is not shown in FIG. 2 because it is obstructed by the lever mechanism. This MEM device can operate as a switch when the gap between the strip lines is shorted. Preferably, where the lever mechanism comprises a conductive material such as copper, the MEM device is operated when the ribbed portion 27(*a*) of the lever mechanism is pulled-in so that the ribbed portion 27(*a*) connects or shorts the 24(*a*) and 24(*b*) strip lines together.

The two arm lever mechanism illustrated in FIG. 2 may be fabricated utilizing different fabrication methods according to aspects of the present invention. One such preferred fabrication method, that of a switch using CMP, involves the MEM device fabricating process 30 illustrated in FIG. 3. A second preferred fabrication method, that of a relay using standard etching techniques, involves a MEM device fabricating process 400 illustrated in FIG. 37. This second fabrication process involves fabricating a MEM relay device with an abrasion resistive contact.

Figure 3:
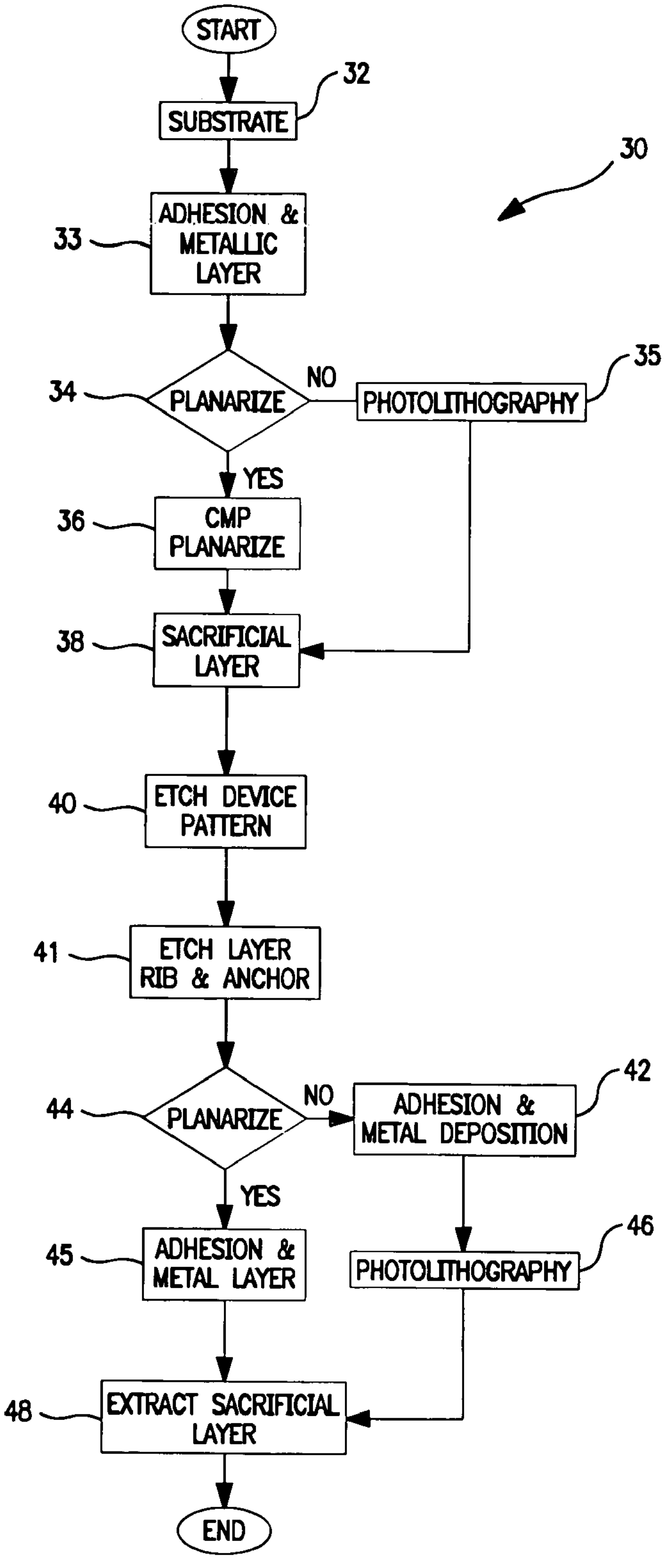
FIG. 3 illustrates a flow chart identifying certain processing steps that may be used for fabricating the MEM device illustrated in FIG. 2.

As will be described in greater detail below, process 30 illustrated in FIG. 3 is particularly useful in fabricating MEM devices where the lever mechanism includes a contoured surface, preferably this contoured surface is a ribbed, metallic surface comprising copper. A ribbed surface lever mechanism has increased rigidity over a lever mechanism having a uni-planar surface. Greater rigidity provides certain advantages such as reduced stiction and easier pull-back. Process 30 of FIG. 3 will be generally described in reference to the MEM device illustrated in FIG. 2 and the various processing steps illustrated in the following figures. Process 400 of FIG. 37 will be generally described in reference to the device illustrated in FIGS. 38-52.

Figure 37:
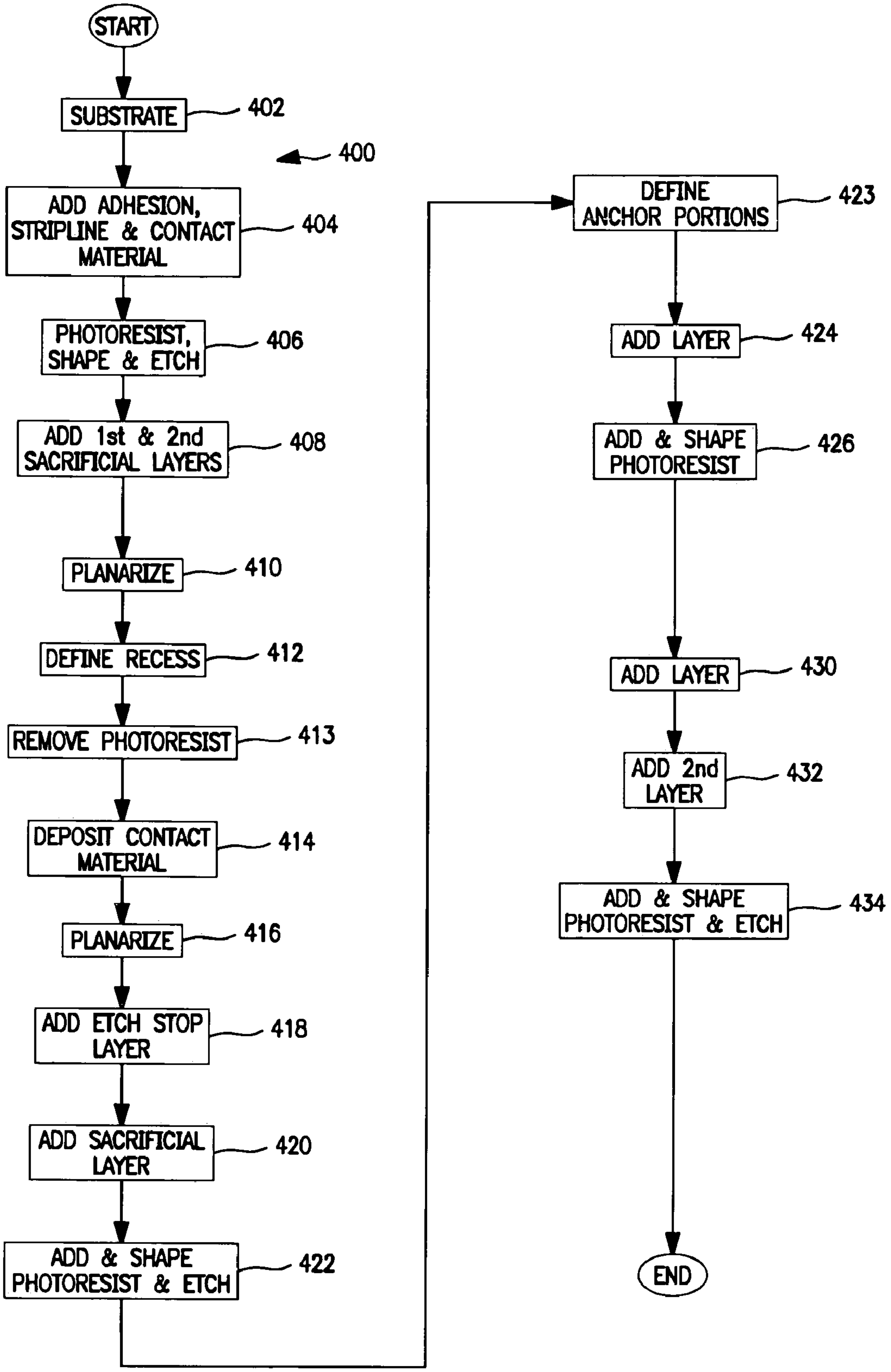
FIG. 37 illustrates a flow chart identifying certain processing steps that may be used for fabricating the MEM device with abrasion resistive contact.

As will be described in greater detail below, process 400 illustrated in FIG. 37 is particularly useful in fabricating a MEM device comprising an abrasion resistive contact area. The MEM device may or may not be a two arm cantilever mechanism. A lever mechanism having such an abrasion resistive contact area results in certain advantages such as a device having increased contact reliability, while also generally reducing high current density induced "hot" spots.

Figure 4:
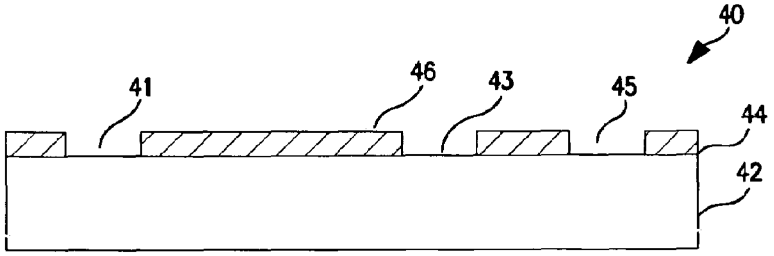
FIGS. 4-6, 7(*a*), 7(*b*), 8, 9, 10(*a*), 10(*b*), 11 and 12 illustrate various processing steps for fabricating the MEM device illustrated in FIG. 2.

Referring now to the process 30 illustrated in FIG. 3, first, at step 32 a substrate is first provided. In one preferred embodiment, this substrates is an insulator such as an oxidized silicon substrate. FIG. 4 illustrates an initial processing step for fabricating the MEM device illustrated in FIG. 2 and incorporates aspects of the present invention. In one preferred arrangement, and as will be explained in greater detail below, the MEM device is fabricated in part by a planarization process, preferably Chemical Mechanical Planarization ("CMP") process. More preferably, in one arrangement, the MEM device is fabricated by way of a triple damascene process.

The CMP process was initially developed to enable next-generation Integrated Circuits (ICs) by ensuring each interconnect level in a semiconductor chip be as flat and smooth as possible before the next level is built. CMP is a preferred manufacturing process since this process offers a sophisticated, reproducible process that has vital characteristics to state-of-the-art Integrated Chip manufacturing. CMP has had a substantial impact in the fabrication of complex, multilevel, and 3-D metal interconnects.

By planarizing certain substrate surfaces during the MEM fabrication process, MEM devices can be produced with certain novel performance and reliability characteristics.

In one preferred arrangement, the MEM device is fabricated by way of a triple copper damascene process. In this process, three indentations are etched into a sacrificial layer. These indentations are then filled with at least one metallic layer (such as copper) and this metallic layer is then planarized down to a level of the sacrificial layer. Before the metallic layer is deposited, an adhesion layer may also be provided. Naturally, such an adhesion layer would also be planarized down to the level of the sacrificial layer during the planarization process.

As shown in FIG. 4, an insulator 42 is provided. Such an insulator may comprise quartz ($SiO_2$), or alternatively, sapphire ($Al_2O_3$), or oxidized silicon or a layer of silicon nitride on top of silicon or a layer of polyimide on silicon.

Along a top surface 44 of insulator 42, a photo-resistive layer 46 is provided. Such a photoresist could be Shipley 1818 which may be deposited onto the substrate by spin coating. In one arrangement, the photoresist layer 46 is used to define a plurality of etching areas. These etching areas along the substrate surface may be etched to form a plurality of substrate wells. In one arrangement, the depth of these substrate wells are all generally similar and are approximately 1-2 microns deep.

Figure 5:
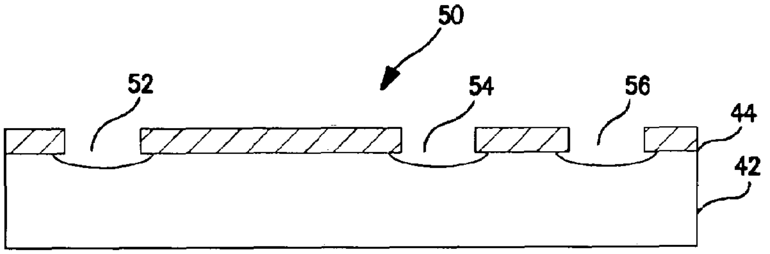

FIG. 5 illustrates various process steps for defining the substrate contact wells. As shown in FIG. 5, the substrate structure 50 has been etched to define three contact regions 52, 54, and 56. These regions have been etched into the top surface 44 of the substrate 42. These etched regions or etched areas will then be used to eventually define various contact regions for the MEM device. For example, where the MEM device is fabricated as a MEM RF switch (such as the MEM device in FIG. 2), the various contact regions would define a pull-in contact, a pull-out contact, and an RF contact. In the arrangement illustrated in FIG. 5, the photoresist 46 has been masked so that the etching step defines three contact wells 52, 54, and 56. However, as those of skill in the art will recognize, alternative contact point arrangements may also be used. Such as, for example, locating one of the contact points on a top portion of a MEM enclosure.

Figure 6:
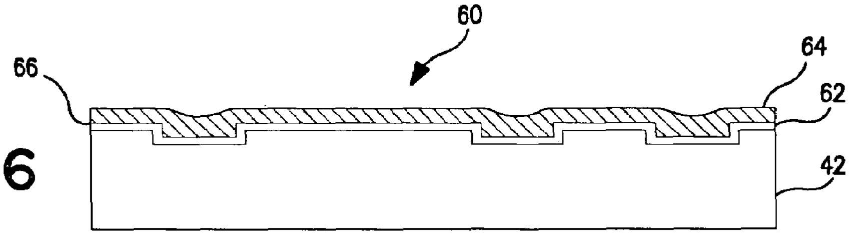

In one arrangement, each contact well 52, 54, and 56 has a width of approximately 15 to 100 microns. Once the substrate has been etched, the next step in the flowchart 30 of FIG. 3 is the step of providing an adhesion layer and then a metallic layer to the contact wells. The process of providing the adhesion layer and the metallic layer is illustrated in FIG. 6. Preferably, before a metallic layer is provided and the various contact points planarized, the contact wells may be provided with an adhesion layer.

An adhesion layer can be provided so as to increase the adhesion properties of the metallic layer to the insulator. For example, where certain insulator substrates are selected, the substrate and metallic composition adhesion characteristics may need to be enhanced. For example, in one arrangement, a 200 Angstrom layer of Ta, TaN, TiW, or Cr and other like materials may be used for such an adhesion layer. This adhesion layer may be applied by either sputtering or electron-beaming the adhesion material along the surface of the well and along the top of the substrate.

As shown in FIG. 6, the substrate structure 60 is provided with an adhesion layer 62. After this adhesion layer 62 is deposited along the top surface, a metallic layer 64 is deposited along a top surface 66 of the adhesion layer 62. This metallic layer 64 may comprise aluminum (Al), copper (Cu), gold (Au), or other such metals having desired conductive characteristics. Preferably, this metallic layer 64 comprises copper. Copper may be a preferred metallic layer material because of copper's conductive properties. Copper may also be preferred because it may be desired to utilize certain processing steps, such as CMP.

In one arrangement, the layer of copper could be on the order of 2 to 4 microns in depth. After the metallic layer 64 has been sputtered onto the adhesion layer 62, the next step involves eliminating excess adhesion material and excess metallic material. This elimination step could take place by way of a chemical planarization process at step 36 or take place by way of photolithography at step 35. Preferably, such an elimination step occurs by way of chemical planarization that is used to planarize the top surface of the substrate. Returning to FIG. 3, this CMP planarization processing step 36 occurs after the adhesion and metallic layer fabrication step 33. In this manner, the planarizing process step removes excess metal residing on the substrate surface. Alternatively, if planarization is not used, conventional photolithography methods may be used at step 35 to remove the excess adhesion and contact material.

Figure 7A:
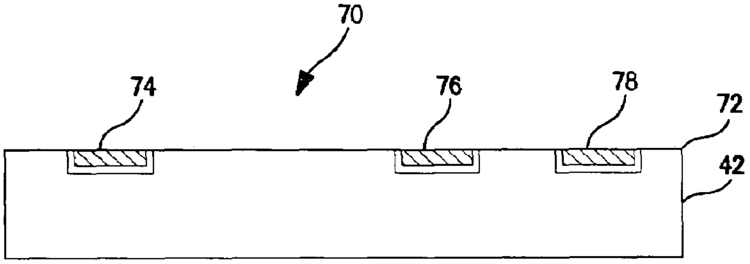
Figure 7B:
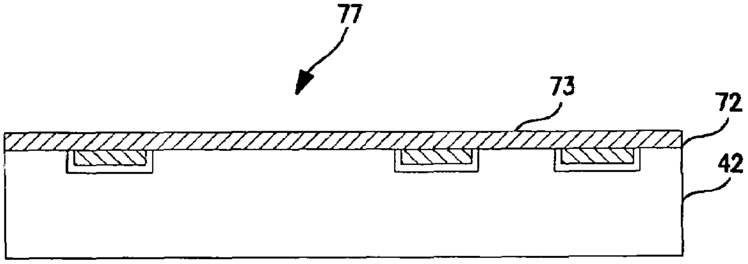

FIG. 7(*a*) illustrates a substrate structure 70 after the planarization process step 36 has been completed. As can be seen from FIG. 7(*a*), the substrate structure 70 is provided with a top surface 72 that is generally smooth. The planarization process also results in the three contact regions 74, 76, and 78 having smooth surfaces. What has been omitted in these drawings is the exact nature of the RF strip. These are either fabricated in a co-planar fashion, ground-signal-ground, or with a ground plane below the RF lines device. These have to be included in the design, but are not shown in these figures for ease of illustration. After completing the planarization step 36 in FIG. 3, a sacrificial layer is provided in step 38. Preferably, this sacrificial layer is $SiO_2$ and is deposited along the top surface of the substrate at a depth of 5 to 7 microns. Other sacrificial layers such as polyimides or metals can also be chosen. In selecting the material, care should be exercised, when removing the sacrificial layer at the end of the process, such that the contacts and the substrate are not being attacked and/or damaged.

Alternatively, before adding a sacrificial layer at step 38, a dielectric layer could be provided over the top surface 72 of the substrate structure 70 (FIG. 7(*a*)). This dielectric layer would act as an insulator. This process step is illustrated in FIG. 7(*b*). As shown in FIG. 7(*b*), a substrate structure 77 is provided wherein the substrate structure of FIG. 7(*a*) now comprises a dielectric layer 73 deposited over top surface 72 of substrate 42. Such a dielectric layer could comprise approximately 1000 Angstroms of an insulator, such as silicon nitrite, or nanocrystalline diamond or other like materials. One advantage of providing such a dielectric layer is that the resulting MEM switch fabricated from the structure illustrated in FIG. 7(*b*) would be able to operate at certain higher frequencies, such as above 2 Giga-Hertz without having to make direct metal-to-metal contact. Since the switch impedance is given by ½πƒC, low values of several Ohms may be obtained for a 20 micrometer by 20 micrometer contact region at an RF frequency of 2 Gigahertz and above. In the above equation, ƒ is the frequency of the RF signal and C is the capacitance of the contact region. Such a dielectric layer may be added during step 38 in FIG. 3 before the sacrificial layer is deposited. For ease of reference and illustration, dielectric layer 73 has been omitted from the following figures.

Figure 8:
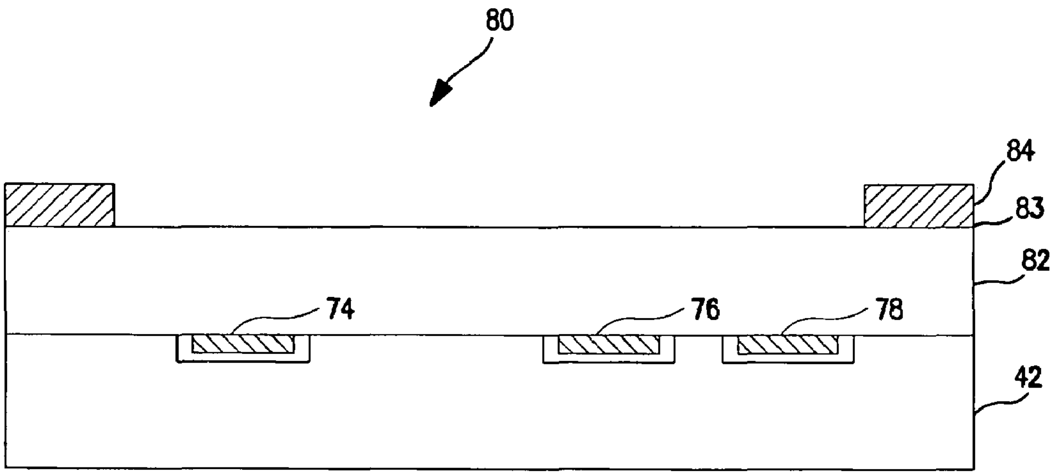

FIG. 8 illustrates another processing step for fabricating the two arm lever mechanism illustrated in FIG. 2. FIG. 8 includes a substrate structure 80 that includes a patterned photoresist layer 84. Photoresist layer 84 is patterned along a top surface 83 of the sacrificial layer 82. Specifically, FIG. 8 illustrates the substrate structure 70 from FIG. 7(*a*) after a sacrificial layer 82 has been deposited. Preferably, this sacrificial layer comprises $SiO_2$. Alternatively, the sacrificial layer could be deposited along the dielectric layer 73 illustrated in FIG. 7(*b*).

Figure 10A:
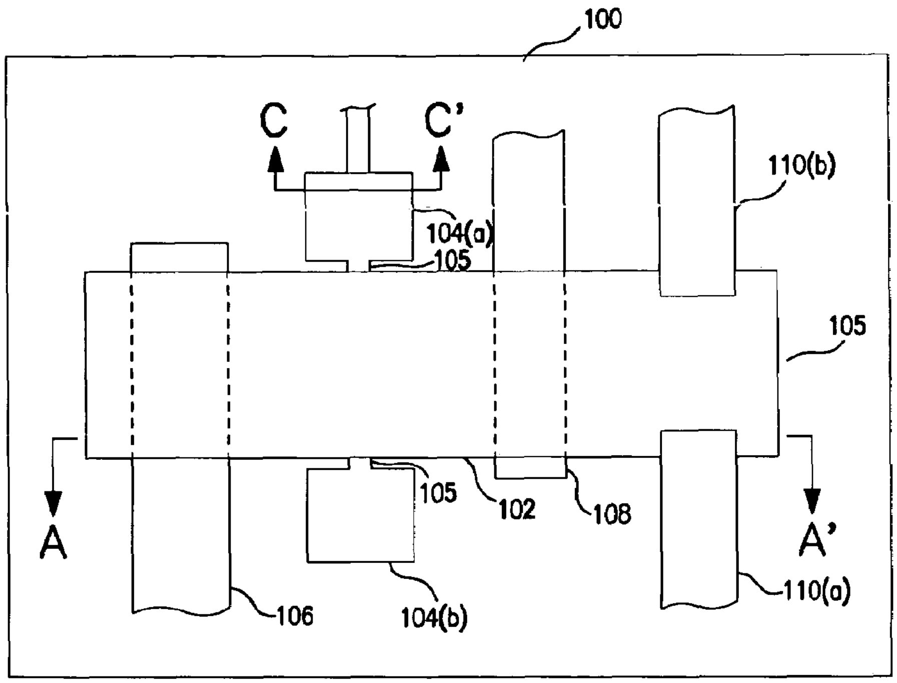
Figure 10B:
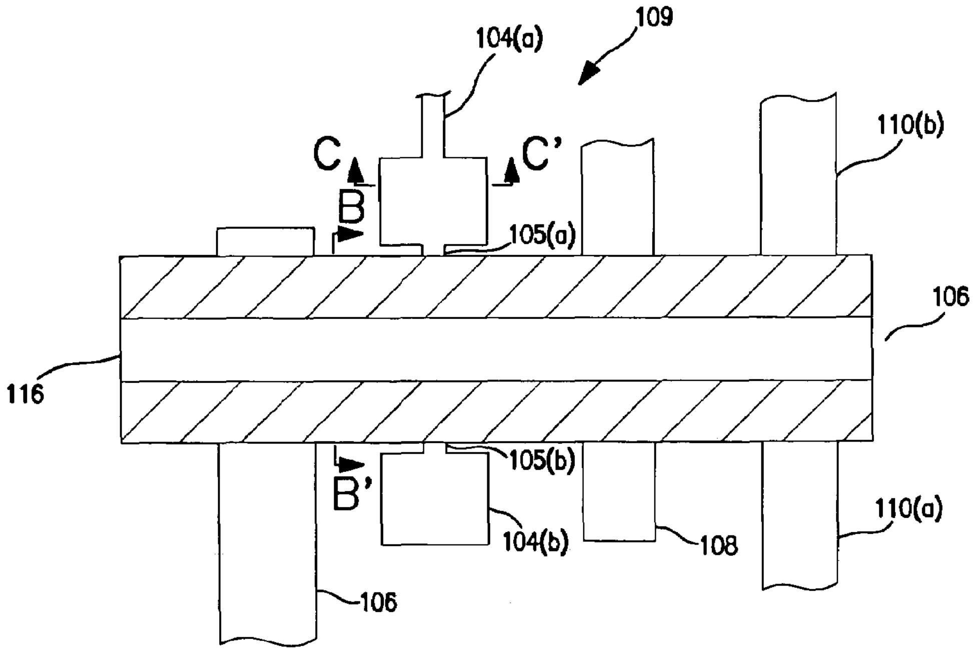

FIG. 10(*a*) illustrates a top view of a preferred pattern 100 that may be used for performing the etch patterning step 40 illustrated in FIG. 3. FIG. 10(*a*) may be used for providing and therefore outlining the two arm lever mechanism portion as well as the two arm lever mechanism anchor portions. Alternatively, two patterns may be used: a first pattern defining the two arm lever mechanism and a second pattern defining the two arm lever mechanism anchor portion. Other patterning processes may also be used.

FIG. 10(*a*) provides a lever mechanism pattern portion 102. As can be seen from FIG. 10(*a*), this pattern portion 102 will define both the two arm mechanism as well as both the first and the second two arm anchor portions illustrated in FIG. 2 residing over the pull-back contact 106, and the pull-in contact region 108. The pattern portion 102 also resides over the switch contact region: both the first contact zone 110(*a*) and the second contact zone 110(*b*). A first portion of the arm lever mechanism 105 will be patterned so as to extend past the first and second contact zones 110(*a*) and (*b*). In addition, a first and a second lever mechanism anchor portion 104(*a*) and (*b*) are pre-patterned.

Figure 9:
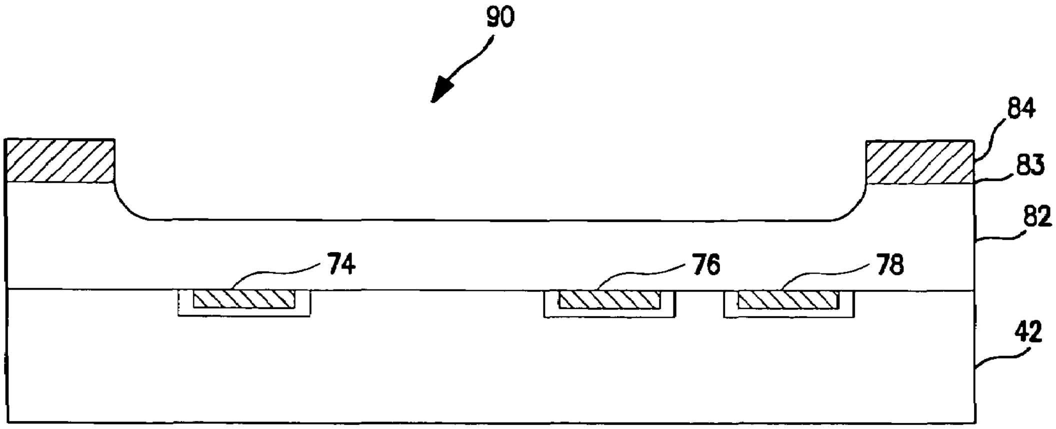

FIG. 9 illustrates a substrate structure 90 that has been etched according to the preferred photoresist pattern 100 illustrated in FIG. 10(*a*). In one arrangement, the sacrificial layer 82 has been etched to a depth of approximately 1-2 microns.

The photoresist layer 84 patterned along the top surface of the sacrificial layer 82 in FIGS. 8 and 9 is pattered so as to define various aspects of a MEM device. For example, the photoresist layer 84 may be patterned to define the two arm lever mechanism 25 illustrated in FIG. 2. Preferably, the sacrificial layer 82 is etched to define both a lever mechanism substrate portion 21 and the lever mechanism anchor substrate portions 23(*a*) and (*b*) (See FIG. 2).

In a next processing step 41, a contoured surface 116 is formed along the length of the two arm lever mechanism. This contoured surface, in this arrangement a rib, provides certain operating advantages such as increased lever mechanism rigidity. Before this rib is etched along the length of the two arm lever mechanism, a photoresist is patterned along the substrate surface. FIG. 10(*b*) illustrates a second preferred pattern 109 for providing and therefore outlining the two arm lever mechanism rib. FIG. 10(*b*) provides an illustration of the pattern illustrated in FIG. 10 superimposed along the top surface of the substrate structure illustrated in FIG. 9. FIG. 10(*b*) includes the pull-back contact 106, the pull-in contact 108, and the switching contact region 110 in FIG. 2. The RF contact region comprises two RF contacts 110(*a*) and (*b*).

Figure 11:
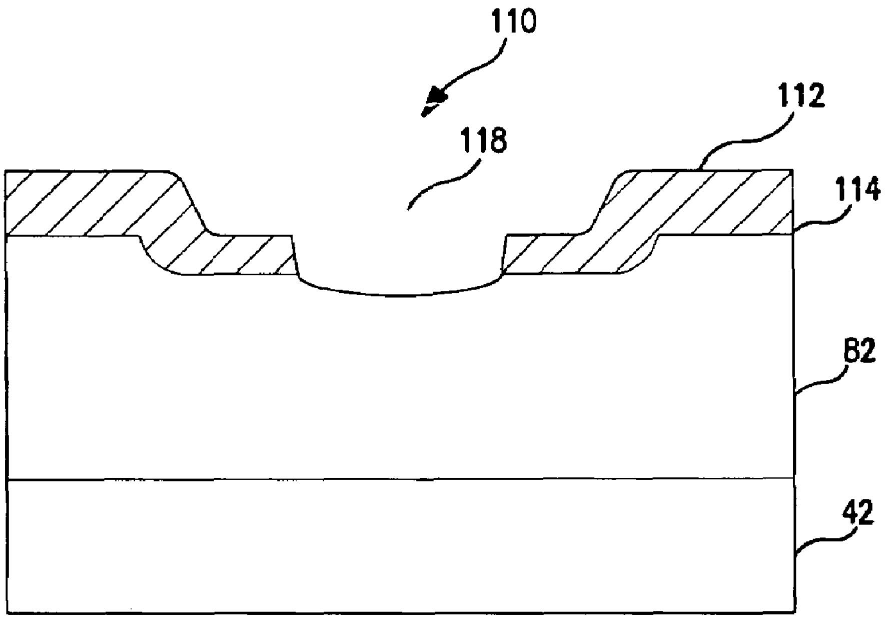

FIG. 11 illustrates a side view 111 along the B-B' cut of FIG. 10(*b*) prior to rib etching. In FIG. 11, a photoresist layer 112 is provided along a top surface 114 of the sacrificial layer 82. Next, the sacrificial layer 82 is then etched so as to define a rib 118 along the length of the cantilever. Preferably, this rib 118 has a depth of approximately 1-2 microns. The photoresist layer 112 is then striped away.

Figure 12:
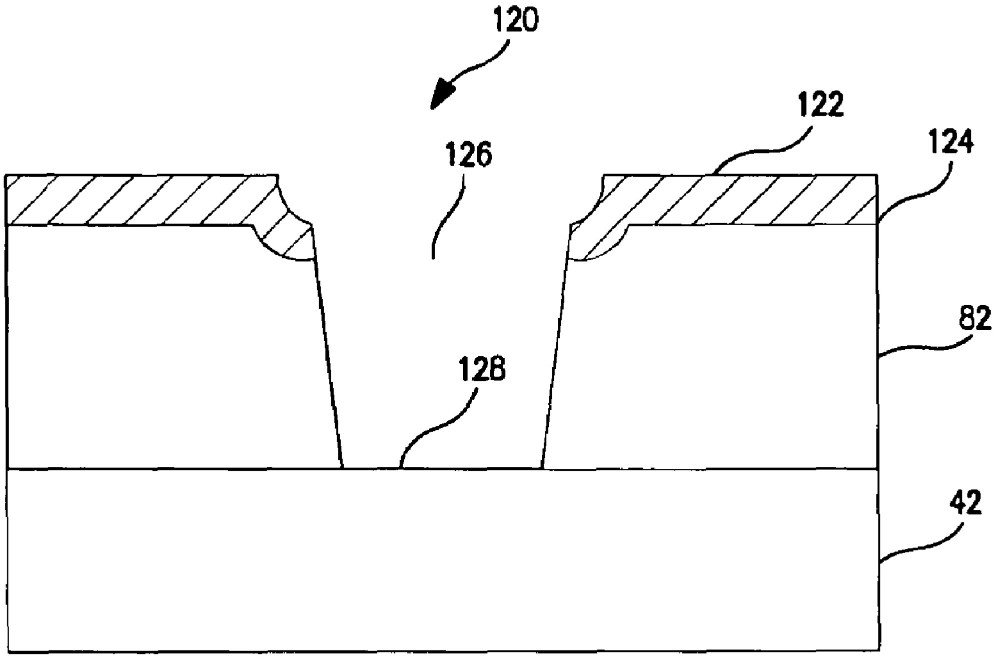

FIG. 12 provides a side view 120 taken along the C-C' cut of FIG. 10(*b*) and illustrates the anchor etching step. In FIG. 12, the substrate 42, the sacrificial layer 82, and a photoresist 122 are shown. The photoresist 122 resides on a top surface 124 of the sacrificial layer 82. In this arrangement, the sacrificial layer 82 has been deposited along the top surface of the substrate 42 to an approximate height of 5 microns. Etching the sacrificial layer 82 defines a lever mechanism anchor cavity 126. Preferably, this lever mechanism cavity 126 extends all the way to the top surface 128 of the insulator 42. As illustrated by the second preferred pattern 109 illustrated in FIG. 10(*b*), for each two arm lever mechanism, a first and a second lever mechanism anchor cavity is formed. After both anchor cavities have been etched, the photoresist 122 is stripped away so that the two arm lever mechanism and lever mechanism anchor portions may be further fabricated.

Returning to FIG. 3, after etching the two arm lever mechanism portion with the rib and both the first and the second anchor portions at step 41, it is determined whether a planarizing process will be utilized for defining both the two arm lever mechanism and the anchor surfaces. This determination is made at step 44. Consequently, a preferred process for fabricating the MEMS device illustrated in FIG. 2 can include a chemical planarization process (such as a triple copper damascene) step or an etching process step.

If at step 44 it is determined that chemical planarization will be used, the process proceeds to step 45. Step 45 involves depositing an adhesion layer and after the adhesion layer is deposited, a metallic layer is provided. Process step 45 will be explained with reference to FIGS. 13(*a-b*) and FIGS. 14(*a-b*). Alternatively, if at step 44 it is determined that chemical planarization will not be used, the process proceeds to step 42. Process step 46, which involves a photolithography step, will be explained with reference to FIGS. 15(*a-b*) and FIGS. 16(*a-b*).

Figure 13A:
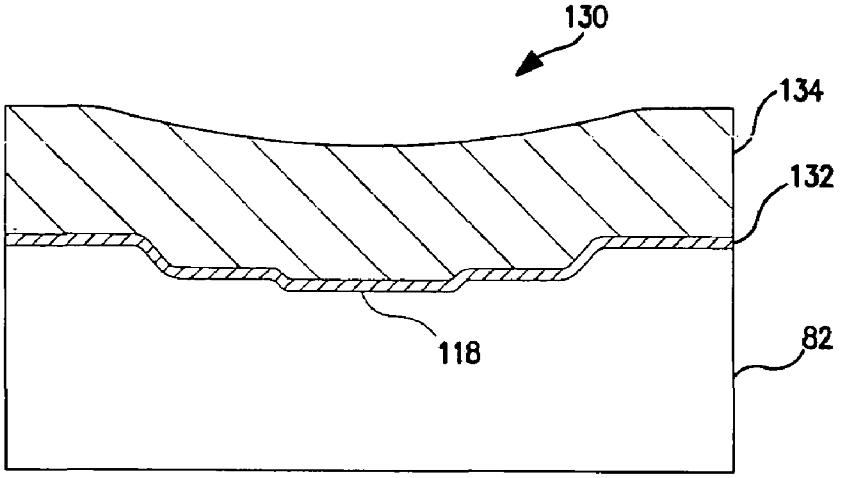
FIGS. 13(*a*) and (*b*) illustrate alternative processing steps for fabricating the MEM device illustrated in FIG. 2.
Figure 13B:
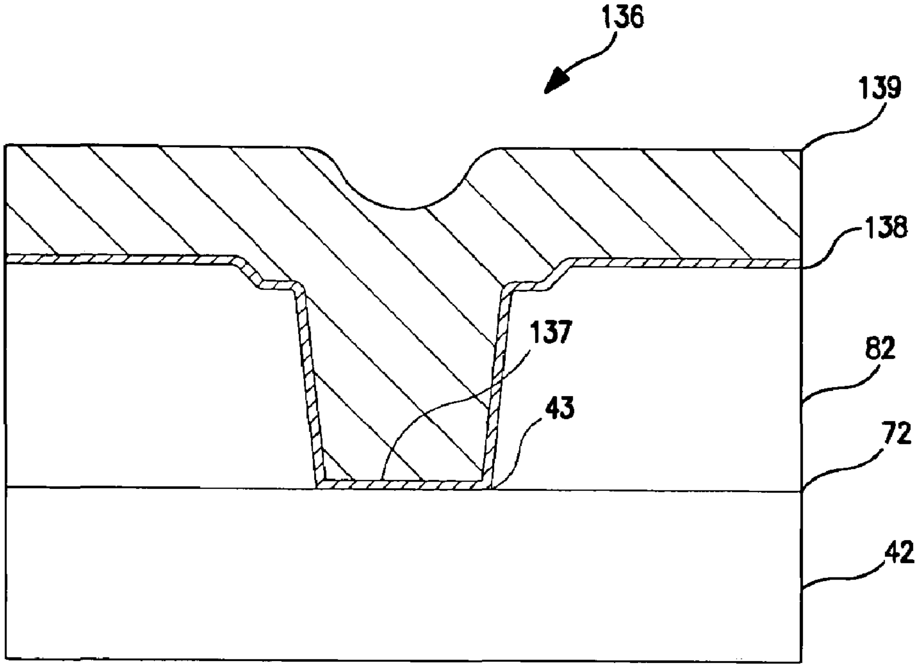

FIG. 13(*a*) illustrates another processing step for fabricating the MEM device illustrated in FIG. 2. FIG. 13(*a*) represents a side view of the two arm lever mechanism after the rib 118 has been etched. Preferably, rib 118 has been etched along the entire length of the lever mechanism as illustrated in FIG. 11 but this is not necessary. Shorter rib lengths may also be used. FIG. 13(*a*) includes a substrate structure 130 wherein an adhesion layer 132 is deposited over the top surface of the sacrificial layer 82. Preferably, this adhesion layer 132 comprises 100 to 200 Angstroms of Ta, Cr, TiW, or other like adhesion layer component. After depositing the adhesion layer 132, approximately 7 microns of a metallic layer 134 is deposited along this etched out cantilever rib. Preferably, this metallic layer 134 comprises copper, gold, or other like metal. Alternatively, this metallic layer 134 comprises a metallic compositon that includes a combination such as Cu/TaN, Cu/Diamond, or Diamond/Cu.

Where the process includes chemical planarization, both the first and the second lever mechanism anchor regions are chemically planarized in a similar manner as the two arm lever mechanism. For example, FIG. 13(*b*) represents a side view of a lever mechanism anchor portion after the anchor cavity 126 has been etched. As discussed previously, two anchor cavities are etched, a first cavity for the first lever mechanism anchor portion and a second cavity for the second lever mechanism anchor portion. FIG. 13(*b*) includes a substrate structure 136 wherein an adhesion layer 138 is provided over the sacrificial layer 82 and along a top portion 43 of the substrate 42. By completely etching the cavity to the top surface 72 of insulator 42, an anchor bottom portion 137 of the anchor provides stability for the two arm level mechanism and allows the lever mechanism to move according to the bias potential applied among the various contact regions. This lever motion is facilitated by a torqueing of the two arms which are supported by the lever mechanism anchors along the top surface 72 of the insulator 42. Preferably, this adhesion layer 138 comprises 100 to 200 Angstroms of Ta, Cr, TiW, or other like adhesion layer component and is deposited at the same time as the lever mechanism adhesion layer 132. After depositing the adhesion layer 138, approximately 7 microns of a metallic layer 139 is used to fill out the anchor cavity. Preferably, this metallic layer 139 comprises copper, gold, or other like metal or a combination such as Cu/TaN, Cu/Diamond, or Diamond/Cu.

Figure 14A:
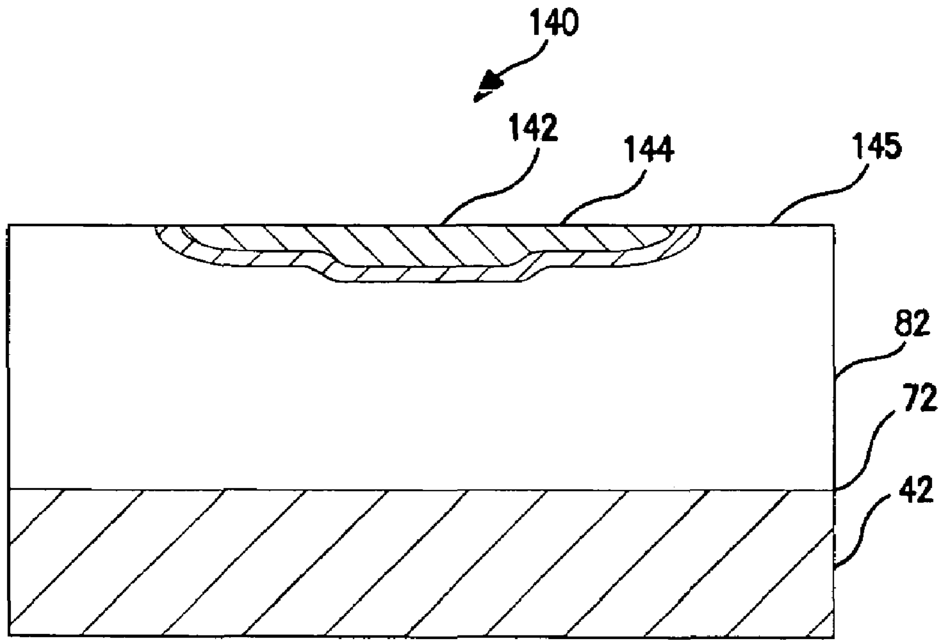
FIG. 14(*a*) illustrates a profile view of a two arm lever mechanism fabricated according to one aspect of the present invention.
Figure 14B:
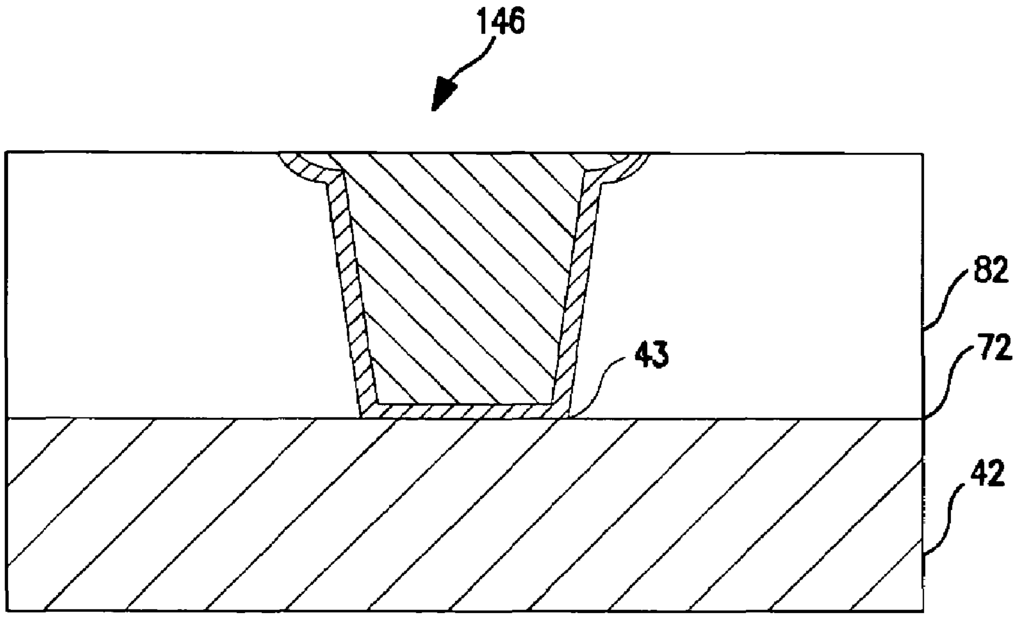

FIG. 14(*a*) illustrates a side view 140 of the two arm lever mechanism 142. After completing the planarization process at step 45 (FIG. 3), the top surface of the two arm lever mechanism has been planarized. FIG. 14(*a*) also illustrates a sacrificial layer 82 having a uniformly planar top surface 145.

Similarly, FIG. 14(*b*) illustrates a side view of the lever mechanism anchor portion 146 after the planarization process. The sacrificial layer 82 in both FIGS. 14(*a*) and (*b*) is etched away, thereby providing a lever mechanism and lever mechanism anchor configuration as shown in the MEMS device illustrated in FIG. 2.

Figure 15A:
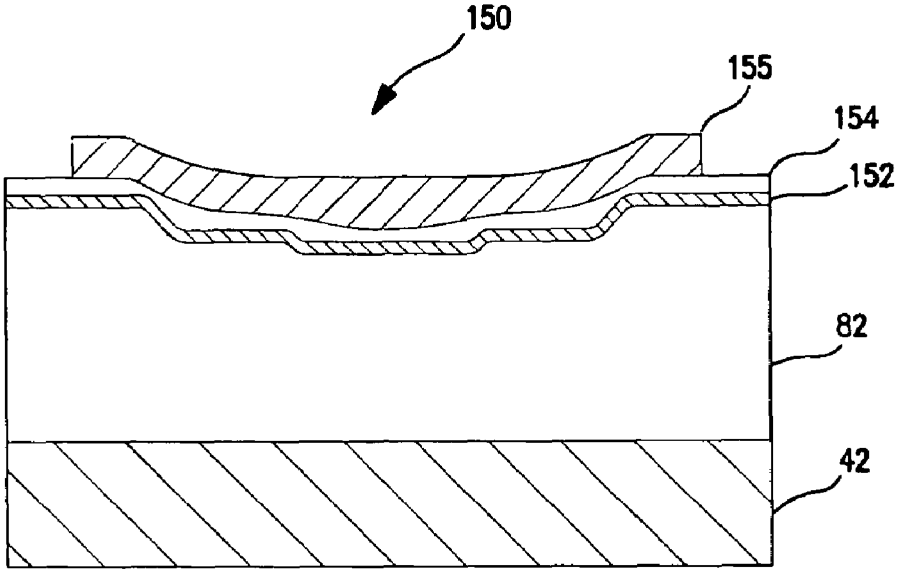
FIGS. 15(*a*) and (*b*) illustrate alternative processing steps for fabricating the MEM device illustrated in FIG. 2.
Figure 15B:
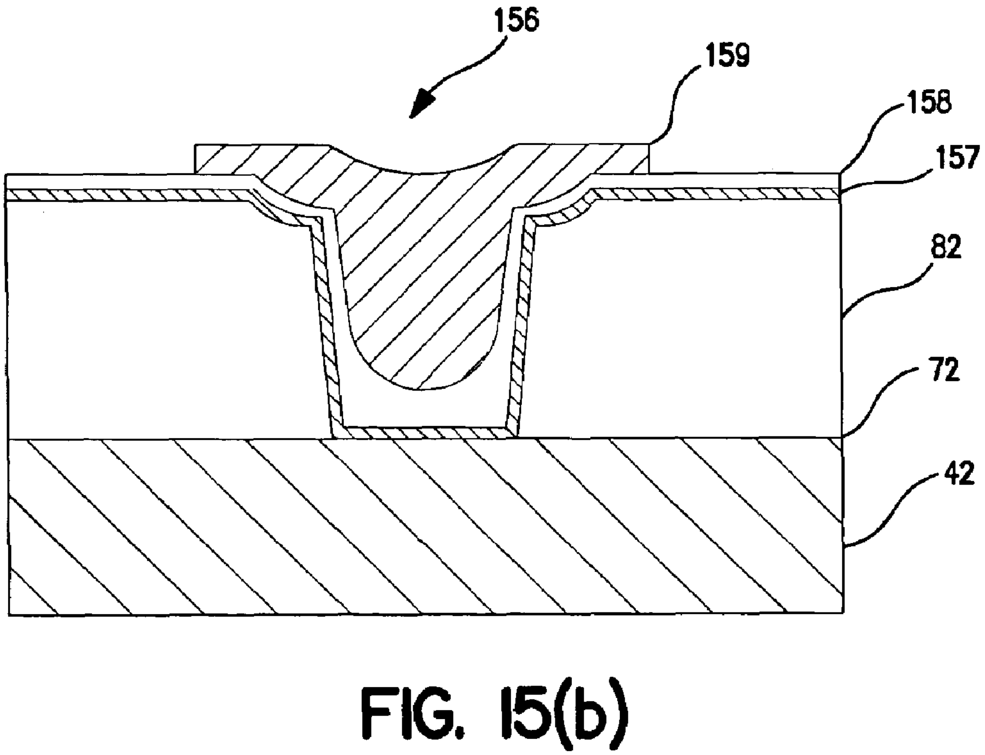

Returning to the fabrication process 30 illustrated in FIG. 3, if the process does not involve planarization after step 45, an adhesion layer and a metallic layer are deposited. These layers are provided over both the etched lever mechanism and lever mechanism anchor portion and then the substrate undergoes photolithography at step 46. These process steps may be illustrated with reference to FIGS. 15(*a*) and (*b*). As illustrated in FIG. 15(*a*), a substrate structure 150 includes the insulator 42 and the sacrificial layer 82. An adhesion layer 152 is provided and on top of this adhesion layer, a metallic layer 154 is deposited. Preferably, the thickness of this metallic layer 154 is not as great as the thickness of the metallic layer 134 deposited in FIG. 13(*a*). Next, a photoresist layer 155 is then deposited. After the photoresist is deposited, exposed, developed, and baked, the metallic layer 154 and the adhesion layer 152 are etched away.

The substrate structure 156 illustrated in FIG. 15(*b*) is processed in a similar manner as structure 150 in FIG. 15(*a*) and is preferably deposited at the same time. As illustrated in FIG. 15(*b*), a substrate structure 156 includes the insulator 42 and the sacrificial layer 82. An adhesion layer 157 is provided and on top of this adhesion layer, a metallic layer 158 is deposited. Preferably, the thickness of this metallic layer 158 is not as great as the thickness of the metallic layer 139 deposited in FIG. 13(*b*). Next, a photoresist layer 159 is then deposited. After the photoresist is deposited, the metallic layer 158 and then the adhesion layer 157 are etched away.

Figure 16:
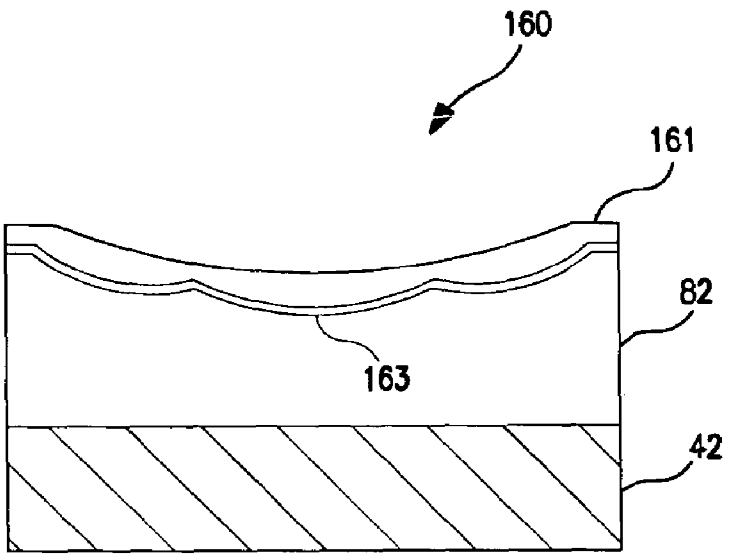
FIG. 16 illustrates a profile view of a two arm lever mechanism fabricated according to an alternative aspect of the present invention.
Figure 17:
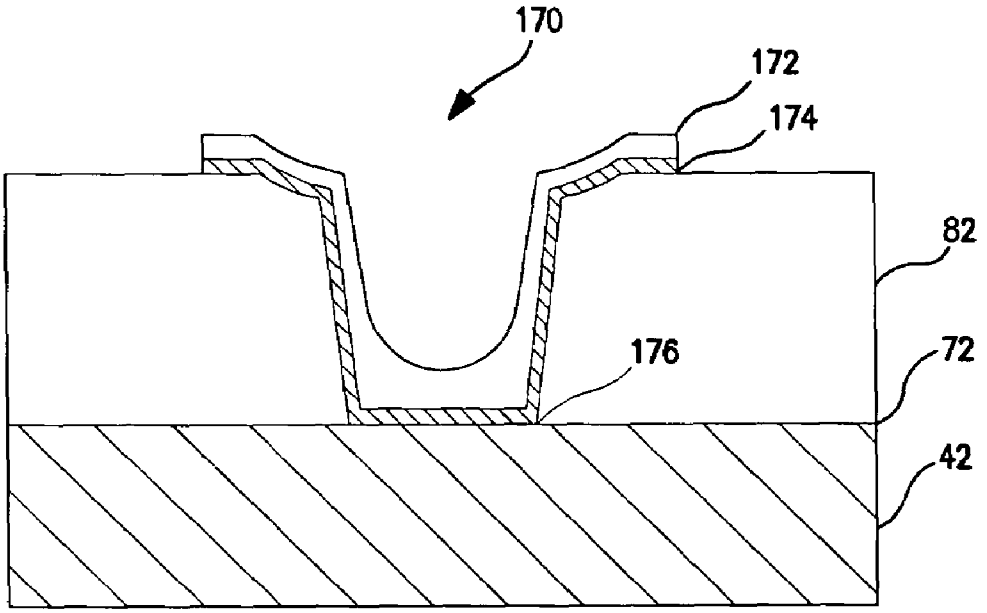
FIG. 17 illustrates a profile view of a portion of a two arm lever mechanism anchor portion fabricated according to an alternative aspect of the present invention.

FIG. 16 provides a profile view 160 of the mechanical lever 161 including rib 163. In FIG. 16, the mechanical lever is now defined except that the sacrificial layer 82 is still shown underlying the lever 161 and still residing along the substrate 42. And FIG. 17 provides a profile view of an anchor portion 170. After the sacrificial extraction step 48 in FIG. 3, the sacrificial layer 82 is etched away. In this manner, an alternative arrangement of the two lever mechanical lever and the mechanical lever anchor configuration shown in the MEM device illustrated in FIG. 2 may be provided.

In operation, the MEM, rib-enforced lever arm pivots around the torque arms, these torque arms are preferably fabricated in a metal such as copper. One aspect of the reliability of the device, typically measured in millions of switching cycles, depends on the fatigue and creep properties of the metal. As those skilled in the art will realize, copper might not be the ideal material. To provide a higher degree of device reliability, a two material system can be employed. For example, in one such two material system, after deposition of the adhesion layer, a layer of about half the thickness of the final torque arms of Cu can be deposited, followed by a material of proven fatigue and creep resistance such as doped nanocrystalline diamond, TaN, Ta, W, or a non-conductive material such as silicon nitride, silicon carbide, etc. CMP is then performed in the same fashion as described above. If a non-conductive material is used, an additional photolithographic step has to be used to open a contact window over one of the anchor regions, thus providing electrical contact necessary to the underlying conductive region for activating the pull-in and pull-back contacts.

Once the MEM device has been fabricated, such as the MEM device illustrated in FIG. 2, the MEM device may be encapsulated. For example, FIG. 2 illustrates a perspective view of one aspect of the present invention wherein a single MEM device has been encapsulated into a micro-chamber of a unitary enclosure 170. As can be seen from FIG. 2, the MEM device is entirely encapsulated in a substrate material. The integral enclosure includes various contact portions extending externally to the enclosure. For example, in the enclosure 20, a first contact region 26, a second contact region 28, and a third contact region 24 is provided along the surface of the substrate 22. In one preferred arrangement, these contact regions extend to other integral enclosures provided on the substrate surface 22. The first contact region 28 can comprise a pull-back contact, the second contact region 26 can comprise a pull-in contact. Where the integral enclosure contains a MEM device operating as a switch (such as an RF switch) internally in a micro-chamber, the third contact region 24 can comprise an RF contact.

The enclosure also includes a side wall structure residing along the substrate surface. Coupled to this side wall structure is an enclosure top portion. This top portion preferably includes a first and a second aperture. As will be described in detail below, these apertures provide a means by which material may escape the enclosure micro-chamber during enclosure fabrication.

Encapsulating the resulting MEM device, such as encapsulating the device illustrated in FIG. 2 in the enclosure 20 illustrated in FIG. 2, results in a number of advantages. For example, encapsulation provides a clean environment for the device to operate. Another advantage of an encapsulated MEM device is that encapsulation can provide for the chamber of the encapsulation to be filled with a type of filler and then sealed. For example, such a filler could include an inert gas such as argon. Further aspects of such a sealing method are provided in detail below.

Figure 18:
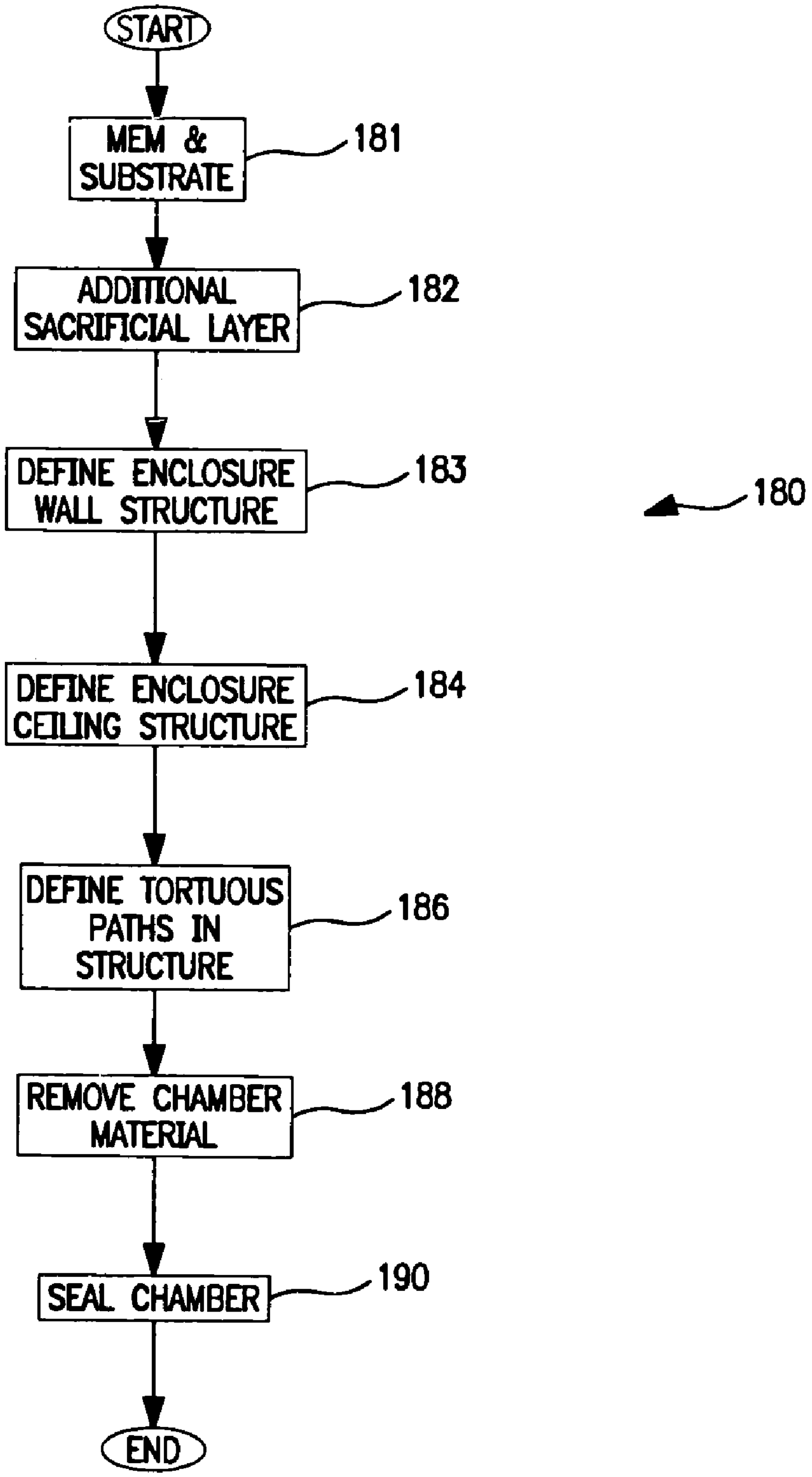
FIG. 18 illustrates a flow chart identifying certain processing steps that may be used for fabricating the MEM enclosure structure illustrated in FIG. 2.

FIG. 18 illustrates a processing step 180 for fabricating an integral MEM enclosure according to one aspect of the present invention. At a first step 181, a non-released MEM device is provided along with a substrate. After the MEM device is provided, an additional sacrificial layer is provided at step 182. This sacrificial layer allows the next step of defining an enclosure wall structure at step 183. After the enclosure wall has been defined at step 183, an enclosure ceiling structure is defined at step 184 is provided. After this enclosure ceiling structure is defined at step 184, a tortuous path in the ceiling structure is defined at step 186. At step 188, the chamber material is removed through the tortuous path and the chamber may then be sealed at step 190. These processes are further illustrated in the following figures.

Figure 19:
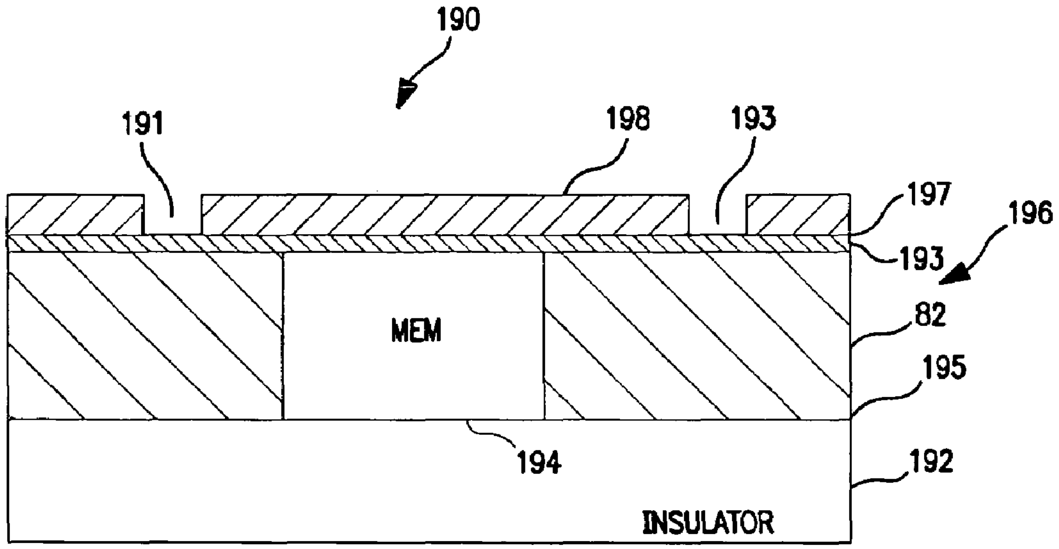
FIG. 19 illustrates an initial processing step for fabricating the MEM enclosure structure illustrated in FIG. 2.

Preferably, the enclosure is fabricated using a planarization process. For example, the first step 181 in process 180 in forming a MEM enclosure cavity is providing a MEM device structure on a substrate. This first step (step 181 in FIG. 18) is depicted in FIG. 19. FIG. 19 provides a substrate structure 190 that includes the MEM device structure 194 residing on a first surface 195 of an insulator 192. The MEM device structure 194 includes both sacrificial material as well as a MEM device. This device can resemble the MEM device fabricated in accordance with the processing steps outlined in FIG. 3 but with one distinction. That distinction being the MEM device 194 will be provided without extracting the sacrificial layer 82 in step 48 from FIG. 3. Consequently, the MEM device provided on the surface 195 of substrate 192 will still include the sacrificial layer 82.

A second sacrificial layer 193 will then be deposited on top of the initial sacrificial layer 82 along with the MEM device structure 194. This is step 182 in FIG. 18. For ease of illustration, both the initial sacrificial layer 82 and second sacrificial layer 193 will be designated as sacrificial layer 196 in the subsequent figures. A photo-resist layer 198 is deposited along a top surface 197 of the sacrificial layer 196. In the arrangement illustrated in FIG. 19, the MEM device structure 194 may be the two arm mechanical lever device illustrated in FIG. 2. Alternatively, MEM devices other then the device illustrated in FIG. 2 may also be used with the arrangement illustrated in FIG. 19. For ease of description and illustration, the control circuitry and activation lines of the MEM device structure are not illustrated in the subsequent figures.

Returning to FIG. 19, preferably, the sacrificial layer 196 has a height of approximately 7 to 15 microns so as to further encapsulate the MEM device structure 194. A photoresist layer 198 is then deposited along a top surface 197 of this sacrificial layer 196. Preferably, the photoresist layer 198 is deposited along certain portions of this sacrificial layer 196. More preferably, the photoresist layer provides for two areas that will be etched using a wet chemical or plasma etching processes generally know to those of skilled in the art. These two etching areas are identified in FIG. 19 as etching area 191*a* and 191*b*. Preferably, etching areas 191*a* and 191*b* are approximately 20 to 100 microns in width.

Figure 20:
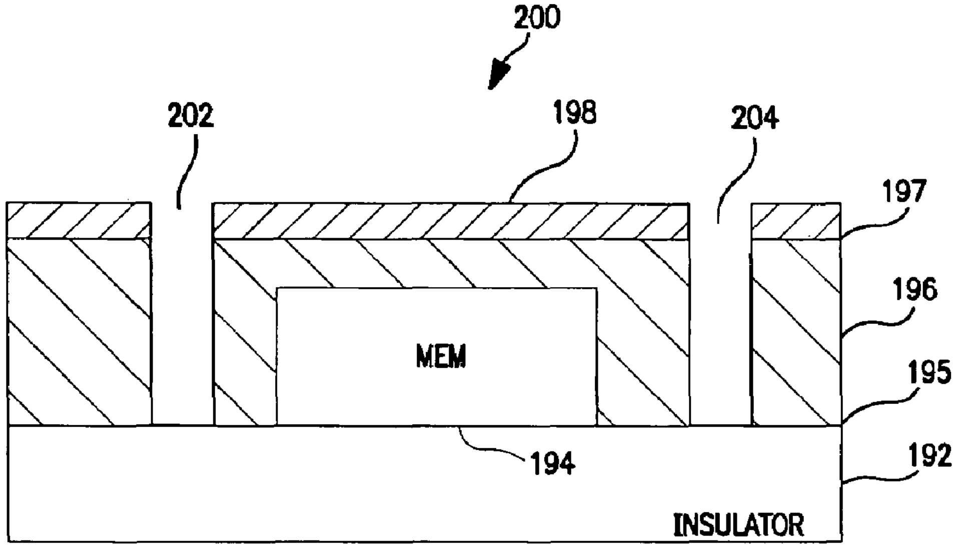
FIGS. 20-22 illustrate various processing steps for fabricating the MEM enclosure structure illustrated in FIG. 2.

After etching the substrate structure 190 illustrated in FIG. 19, the etched substrate structure resembles the illustration provided in FIG. 20. FIG. 20 provides a substrate structure 200 that includes a first substrate cavity 202 and a second substrate cavity 204. The first and second cavities 202, 204 extend from the top surface 197 of the sacrificial layer 196 and extends to the top surface 195 of the insulator 192.

Figure 21:
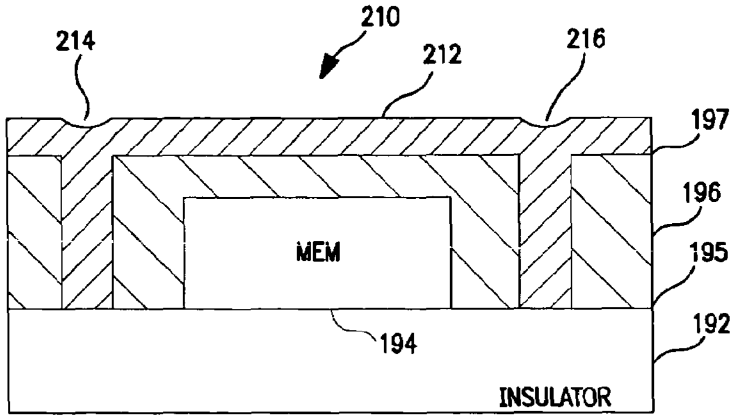
Figure 22:
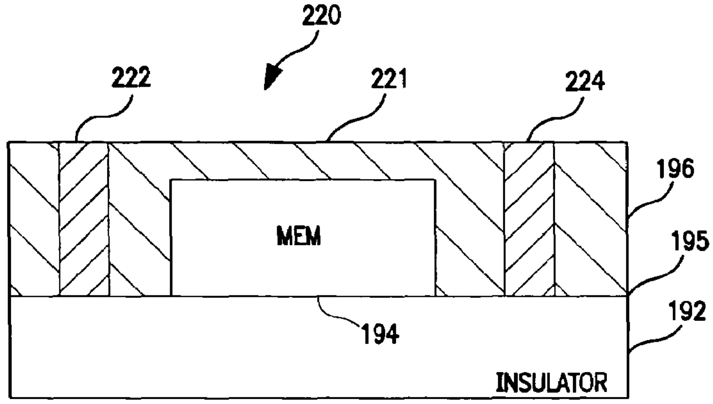

After stripping away the photoresist layer 198 in FIG. 20, the next processing step for fabricating a MEM enclosure involves depositing a layer of poly-crystalline silicon or polyimide on the sacrificial layer top surface and into areas 202 and 204 in FIG. 20. For example, as can be seen from FIG. 21, the substrate structure 210 includes additional layer 212 wherein this additional layer 212 now forms a first wall structure 214 and a second wall structure 216. The first and second wall structures 214, 216 essentially surround the MEM device structure 194. As will be discussed in further detail below, the first and second wall structure defines an enclosure wall structure that surrounds the MEM device structure 194. In a next processing step that is illustrated in FIG. 22, the additional layer 212 is planarized. Preferably, this additional layer 212 is planarized by way of CMP.

Planarization of the additional layer 212 results in the substrate structure 220 illustrated in FIG. 22. As illustrated in FIG. 22, the substrate structure 220 includes the MEM device structure 194 now residing internal to the sacrificial layer 196 while also being surrounded by the sacrificial material. The sacrificial material residing above the insulator surface 195 and between the first side enclosure 222 and the second side enclosure 224 defines a micro-chamber 221.

Figure 23:
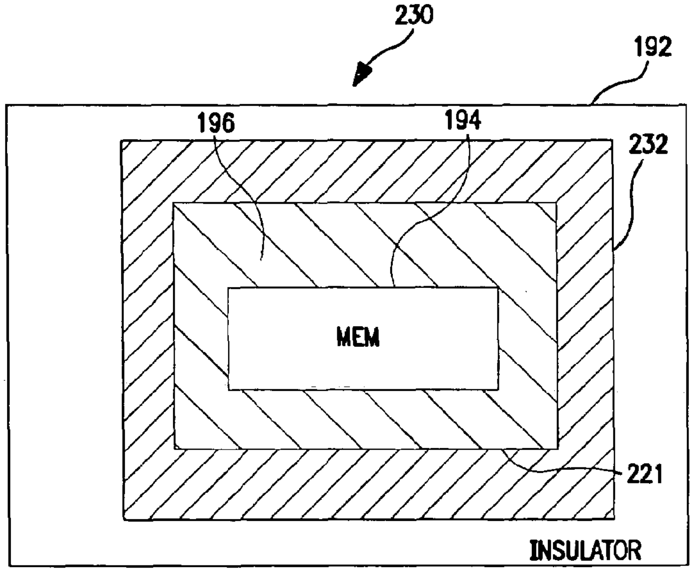
FIG. 23 illustrates a top view of the MEM enclosure structure shown in FIG. 2.

FIG. 23 provides a top view 230 of the substrate structure 220 illustrated in FIG. 22. As can be seen from FIG. 23, after the planarization of the top layer 212 (FIGS. 21 and 22), there is now a surrounding wall structure 232 that is positioned around the micro-chamber 221 that envelopes the MEM device structure 194. One advantage of structure 232 is that each fabricated MEM device that resides on the substrate surfaced 192 is now physically isolated from an adjacent MEM devices by an independent surrounding wall structure, such as structure 232.

One advantage of isolating each MEM device in a separate insulation chamber is that if one MEM device has been contaminated, another adjacent device will not be contaminated. Another advantage is that the MEM structure device will be less susceptible to mechanical failure due to external contamination. Yet another advantage is that each enclosure may be individualized. For example, where one enclosure has been hermetically sealed and includes one type of gas, an adjacent enclosure could have different types of gases. Details on the encapsulation and sealing methods are provided below.

Figure 24:
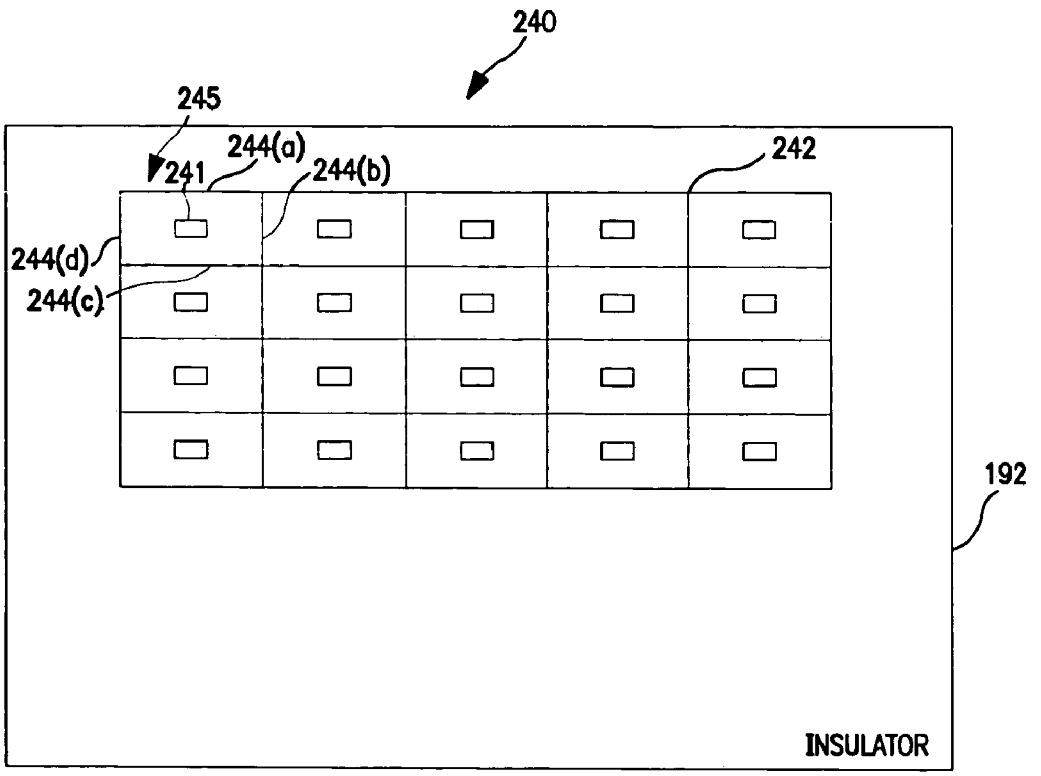
FIGS. 24 and 25 illustrate alternative top views of the MEM enclosure structure shown in FIG. 22.

FIG. 24 provides an alternative illustration as to the MEM configuration provided in FIG. 23. The MEM substrate configuration 240 illustrated in FIG. 24 provides a top view of one arrangement of an array of MEM devices. The substrate configuration 240 includes an array of MEM devices reproduced along the surface of substrate 192. Each MEM device in the array is enclosed by a surrounding structure. For example, MEM device 241 is surrounded by surrounding enclosure 245. Enclosure 245 comprises four walls: 244(*a*), 244(*b*), 244(*c*), and 244(*d*). Each of the four walls 244(*a-d*) can have a thickness of from 20 to 100 microns. As those of skill in the art will recognize, other MEM device arrays are also possible.

Figure 25:
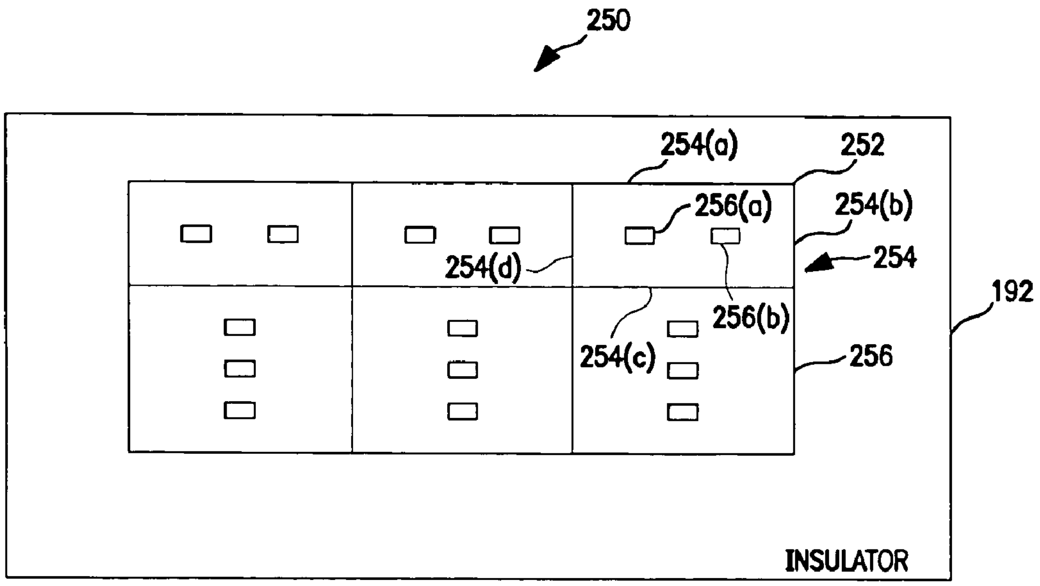

For example, the MEM device layout 240 illustrated in FIG. 24 could be revised so that more than one MEM device is included in each surrounding wall enclosure, such as enclosure 245. For example, FIG. 25 illustrates one such alternative arrangement. FIG. 25 includes a MEM layout 250 that resides on a substrate layer 192. The MEM layout 250 can be fabricated in a similar manner as the layout shown in FIG. 18. However, each MEM surrounding structure of FIG. 25 provides isolation to at least two MEM devices residing within a surrounding structure. Some of the MEM surrounding structures of FIG. 25 provide isolation to more than two MEM devices. For example, the MEM device array 252 in FIG. 25 includes an array of MEM devices fabricates on the surface of substrate 192. In a first portion of MEM layout structure 252, two MEM devices 256(*a*) and 256(*b*) are provided in enclosure 254. Enclosure 254 comprises four walls: 254(*a*), 254(*b*), 254(*c*), and 254(*d*). Each of the four walls 254(*a-d*) can have a thickness ranging from 20 to 100 microns. Alternatively, on the same structure, a variety of layouts could be fabricated. For example, as those of skill in the art will recognize, such an alternative construction may depend on the various types of MEM devices to be included on the same chip such as switches, variable capacitors, oscillators, and other like MEM devices.

Another advantage of the MEM arrangement is the ability to isolate defective devices. For example, as previously discussed, MEM devices have certain operating flaws that may arise during fabrication, device processing, device cleaning, device separation, etc. For example, stiction is a concern that often arises when investigating the failure rate of MEM devices. If a failing MEM device were to be contaminated with, for example, liquid, such a contamination would be limited to the encapsulated or enclosed MEM device and would not contaminate an adjacent MEM device.

Figure 26:
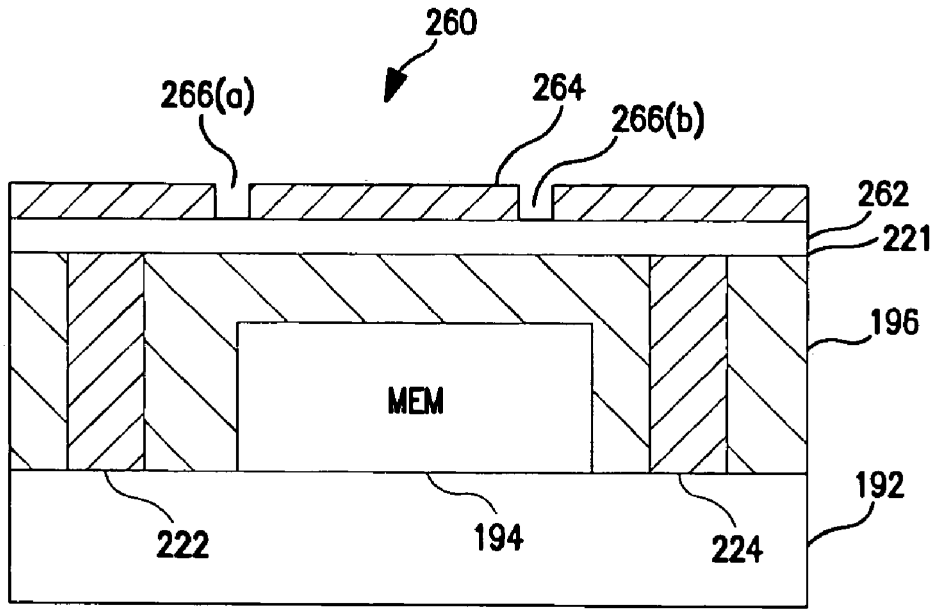
FIG. 26 illustrates another processing step for fabricating an integral enclosure for a MEM device illustrated in FIG. 2.

Another advantage of this arrangement is that a certain amount of mechanical isolation and/or protection is provided to each individual MEM device. Another advantage relates to the containment of contamination. For example, if a MEM has been contaminated with some type of fluid or contaminated with some type of air-born contaminant, MEM devices adjacent such a contamination would not be contaminated. For example, returning to FIGS. 22 and 23, if the MEM structure device 194 included in enclosure 232 was contaminated, this contamination would not affect the operability of adjacent MEM devices. Similarly, turning to FIG. 25, if the two MEM devices located in MEM device array 252 were contaminated, the three MEMS devices located in adjacent array 256 would not be affected. After the top layer 212 in FIG. 21 has been planarized as shown in FIGS. 22 and 23, an additional layer of material is deposited along the top surface of the sacrificial layer. FIG. 26 illustrates this next processing step which is step 184 in the process provided in FIG. 18.

As can be seen from FIG. 26, an additional layer 262 is deposited along the now planarized top surface of the sacrificial layer 196. A photoresist layer 264 is also deposited on top of layer 262. In one arrangement, this additional layer 262 comprises a material that is similar to the material making up the two side wall structures 222 and 224. However, in an alternative arrangement, the additional layer 262 comprises a material that may be different than the side wall material. For example, the additional layer material could comprise a material having certain desired optical properties. For example, in one arrangement the layer 262 comprises a transparent material or may have other desired optical properties such as being transparent to ultra violet or infrared rays.

FIG. 26 provides a substrate structure 260 that includes a photoresist 264 deposited on top of the sacrificial layer 196. In one arrangement, the photoresist 264 is masked to define a plurality of enclosure apertures: In FIG. 26, the photoresist 264 defines a first aperture 266(*a*) and a second aperture 266(*b*). Both the first and the second aperture 266(*a*) and (*b*) are preferably positioned so that both the first and second aperture reside over the MEM device cavern as defined in part by the first cavern wall and the second cavern wall 222, 224. Alternative aperture locations may also be used.

Figure 27:
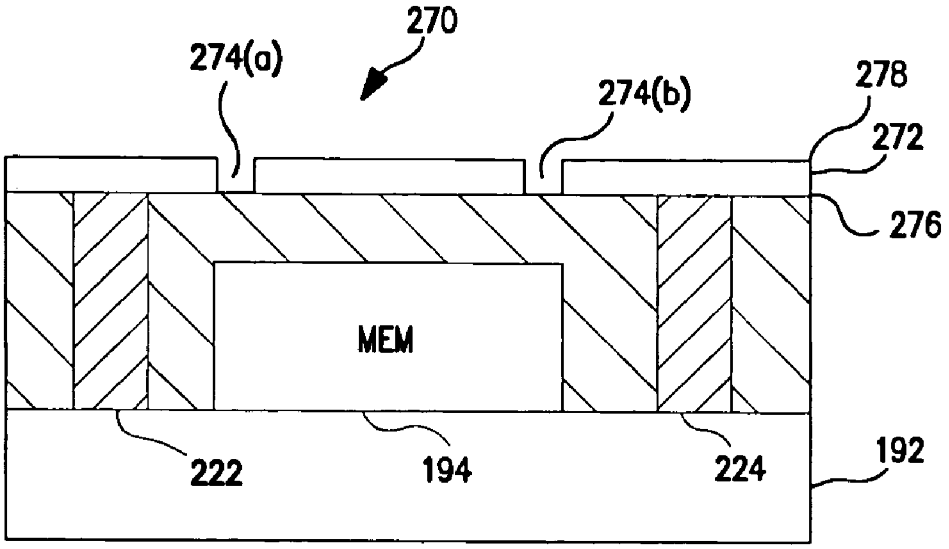
FIGS. 27-33 illustrate various processing steps for fabricating an integral enclosure for a MEM device illustrated in FIG. 2.

In a next processing step, the substrate structure 260 is then etched and the photoresist 264 is stripped away. The resulting substrate configuration is illustrated in FIG. 27. FIG. 27 illustrates a substrate structure 270 that includes a top layer 272 that now defines two apertures: a first aperture 274(*a*) and a second aperture 274(*b*). Each aperture extends from a top surface 278 of additional layer 272 to a bottom surface 276 of the additional layer 272.

Figure 28:
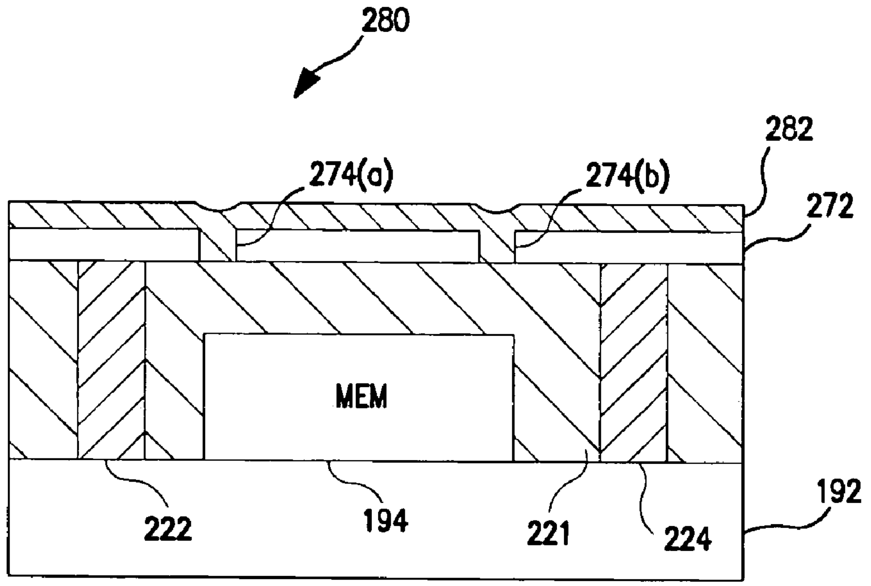

In a next processing step that is illustrated in FIG. 28, another layer is deposed over the substrate configuration illustrated in FIG. 27. As shown in FIG. 28, the additional layer 282. This additional layer 282 includes material that defines the top most layer and also is deposited into both the first aperture 274(*a*) and second aperture 274(*b*). In one arrangement, this top most layer material is a sacrificial substance and comprises essentially the same material as the sacrificial substance that is used to form the MEM enclosure micro-chamber 221.

After the depositing of the top most layer 282 illustrated in FIG. 28, another photoresist layer is provided. This additional photoresist layer will be used to help define a tortuous path extending into the cavern containing the MEM device 194. As will be explained in greater detail below, the tortuous paths will enable the sacrificial material that resides within the enclosure cavern to be etched away. In this manner, the tortuous paths will allow the process to still have an enclosure surrounding the MEM device while also releasing the MEM device to thereby allow operation.

Figure 29:
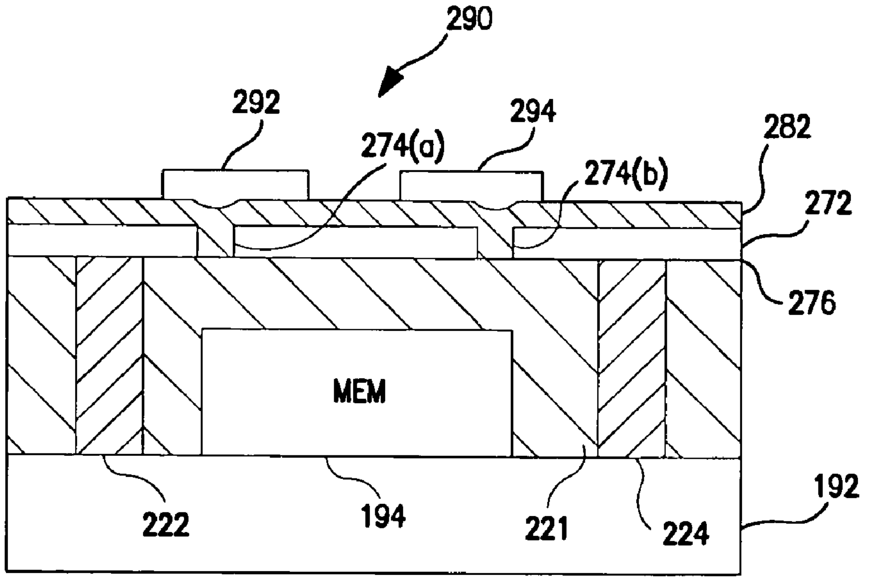
Figure 30:
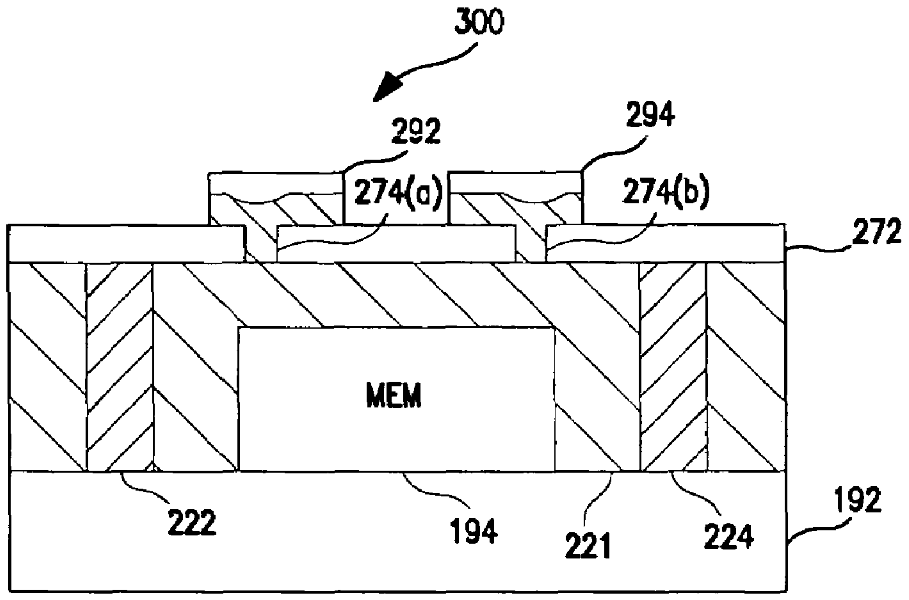

The process step of providing an additional photoresist layer is illustrated in FIG. 29. As with other processing steps providing a photoresist layer, the photoresist layer provided in FIG. 24 is patterned to cover only a portion of the top surface. Preferably, the photoresist layer is patterned over the top surface of material 282 so as to create at least two photoresist pads: a first pad 292 and a second pad 294. More preferably, the first pad 292 is positioned over the first aperture 274(*a*) and the second pad 294 is positioned over the second aperture 274(*b*). FIG. 30 illustrates the substrate shown in FIG. 29 after etching layer 282 and before removal of the photoresist pads 292, 294.

Figure 31:
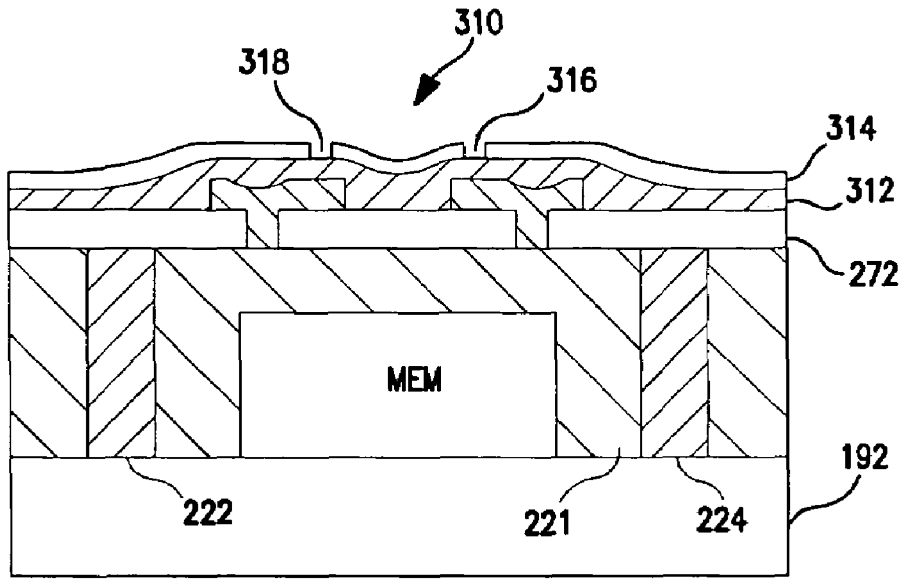

FIG. 31 illustrates yet another processing step. As shown in FIG. 31, the substrate structure 310 now includes an additional layer 312. Layer 312 is deposited over the top surface of layer 272 and the edge layer 282. Preferably, layer 312 comprises a material similar to the material used for the wall material 222 and 224 or the top layer 272. A photoresist layer 314 is also provided. Photoresist layer 314 is used to define two labyrinth hole openings 318 and 316. The substrate structure 310 is then etched.

Figure 32:
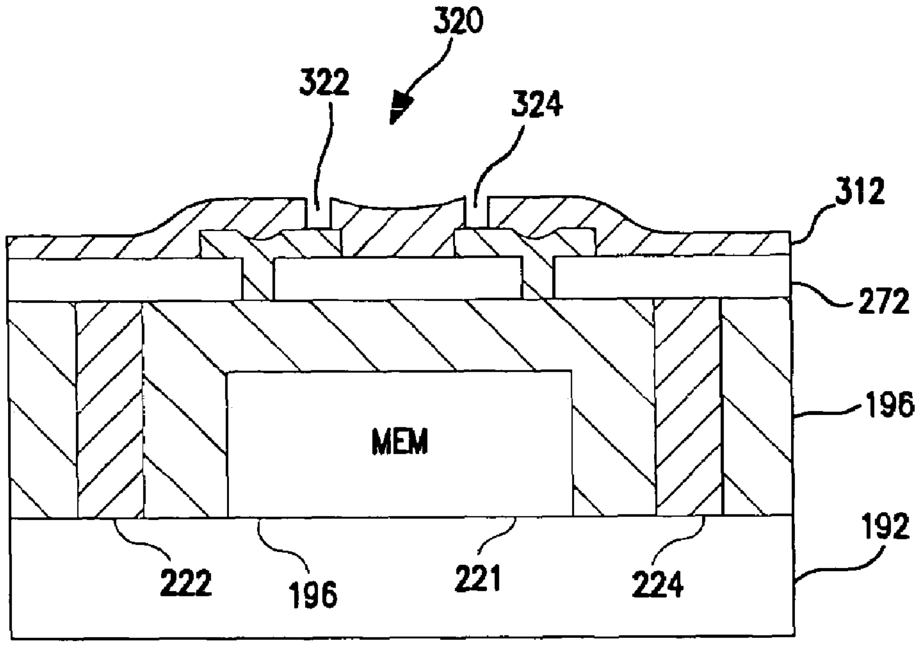

FIG. 32 illustrates a substrate structure that results after etching structure 310 illustrated in FIG. 31 and after photoresist removal. As shown in FIG. 32, a substrate structure 320 is provided wherein the top most layer 312 has been etched so as to create a first tortuous path entrance 322 and a second tortuous path entrance 324. Path entrances 322 and 324 enter into or extend from the top layer 312 to the bottom surface of layer 272.

Figure 33:
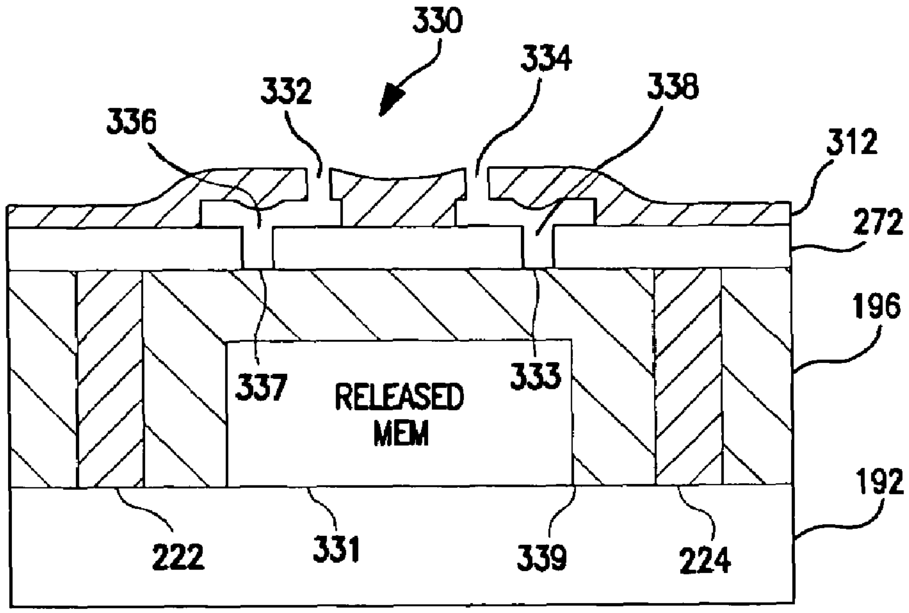

FIG. 33 illustrates a released MEM device 331 residing on the substrate 192. As can be seen from FIG. 33, both tortuous path openings 332, 334 are provided over the MEM device cavity. Now that the tortuous paths 336, 338 have been defined, which in FIG. 18 is step 186, the sacrificial layer material 196 (including both the first sacrificial material 82 and the second sacrificial material 193 (FIG. 19)) deposited in the micro-chamber 221 may be removed. Removing sacrificial layer 196 internally to the enclosure releases the MEM device for operation. Extracting the sacrificial material from the enclosure chamber is step 188 in FIG. 18.

Preferably, this sacrificial material is removed by supplying an etchant(s) by way of the tortuous paths 336, 338 and the etchant(s) will then be removed by these same paths as well. The MEM device is also released during this process. After removing the chamber sacrificial material 196, the substrate structure 330 and released MEM device 331 in FIG. 33 resembles that integral MEM device enclosure illustrated in FIG. 2 and the MEM device resembles the two arm lever mechanism illustrated in FIG. 2.

Figure 34:
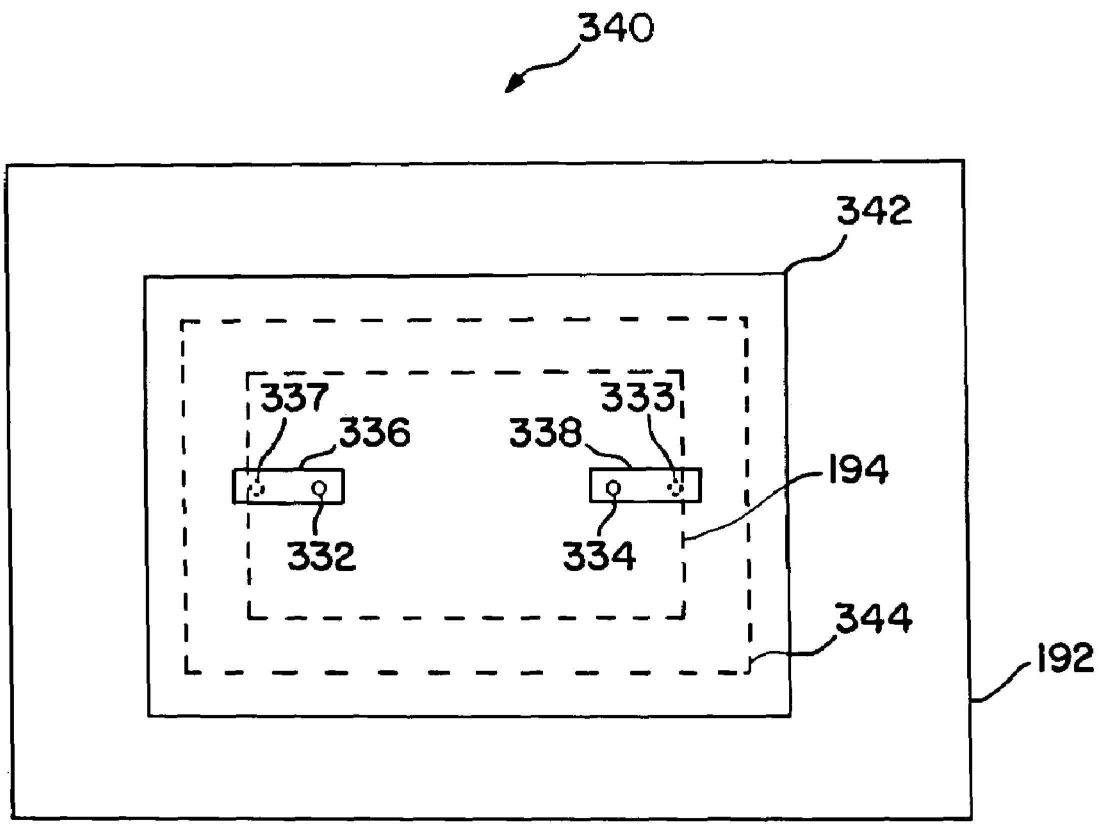
FIG. 34 illustrates a top view of the MEM enclosure structure illustrated in FIG. 33.

FIG. 34 provides a top view of the MEM device enclosure illustrated in FIG. 33. As can be seen from this top view illustration 340, the MEM device structure 194 resides on substrate 192 and has a surrounding enclosure 342. This surrounding enclosure 342 has an inner enclosure wall 344 that is illustrated as a dotted line extending around a circumference of the substrate. Centered near the MEM device structure 194 are both the first and the second tortuous path openings 332 and 334. These path openings 332, 334 do not extend directly into the chamber but rather extend in a labyrinth fashion into the micro-chamber 339. Path openings 333, 337, extend into the micro-chamber 339. Providing such a non-linear path structure has certain advantages. For example, such a non-linear structure decreases the susceptibility of contamination. Such a non-linear path also facilitates the ability to hermetically seal the device enclosure without damaging the MEM device.

Figure 35:
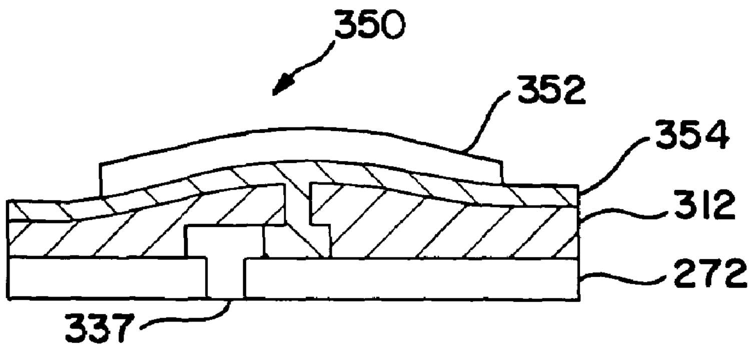
FIG. 35 illustrates an alternative integral MEM device enclosure fabricated according to one aspect of the present invention.

FIG. 35 provides one arrangement for sealing the integral enclosure 330 illustrated in FIG. 33. FIG. 35 illustrates only a top portion 350 of the enclosure 330 illustrated in FIG. 33. This top portion 350 includes the surface layer 272 and upper surface layer 312. A sealing layer 354 is provided on top of this upper surface layer 312. Preferably, such a sealing layer comprises a metallic layer such as tungsten, aluminum, copper, or other like metal.

As can be seen from FIG. 35, one advantage of tortuous path 336 is that the deposited sealant will not extend into to the chamber containing the MEM device structure and therefore will not effect the operation of the MEM device. Rather, because of the labyrinth nature of the tortuous path, the deposited sealant will not progress past the tortuous chamber opening 337. After the sealing layer 354 is provided, a photoresist layer 352 may be deposited. The substrate structure 350 may then be etched and the photoresist layer 352 may then be removed.

One advantage of being able to seal enclosure 330 is that this sealing process allows the enclosure to be hermitically sealed. Other advantages includes the possibility of being able to manipulate the operating environment of the MEM device. For example, a MEM device may be fabricated to operate in sealed enclosure containing an inert gas. Those of ordinary skill in the art will recognize that other operating media may also be used.

As discussed in general detail above, providing an encapsulated MEM device results in a number of advantages. For example, encapsulating a MEM device could result in a MEM device operating in a hermetically sealed environment. FIG. 35 illustrates one such environment. For example, FIG. 35 includes a MEM device residing along a top surface of a substrate, preferably an insulator. The MEM device is residing inside of an encapsulating enclosure that is fabricated according to the process illustrated in FIG. 3 and described in detail above. In this illustration, the enclosure chamber has been vacuum sealed and a metallic plug has been provided in one of the tortuous paths. In this manner, the MEM enclosure can be used to hermetically seal the MEM device. Providing an inert gas inside such a hermetically sealed device would be advantageous. For example, during normal operation, when the contacts of such a device switch and micro-arcs occur, air could possibly oxidize the Copper and degrade switching performance. By providing an inert gas such as Argon, or Nitrogen, such contact oxidation could be reduced. Alternatively, an arc prevention medium such as $SF_6$ may be provided prior to sealing the enclosure.

Figure 36:
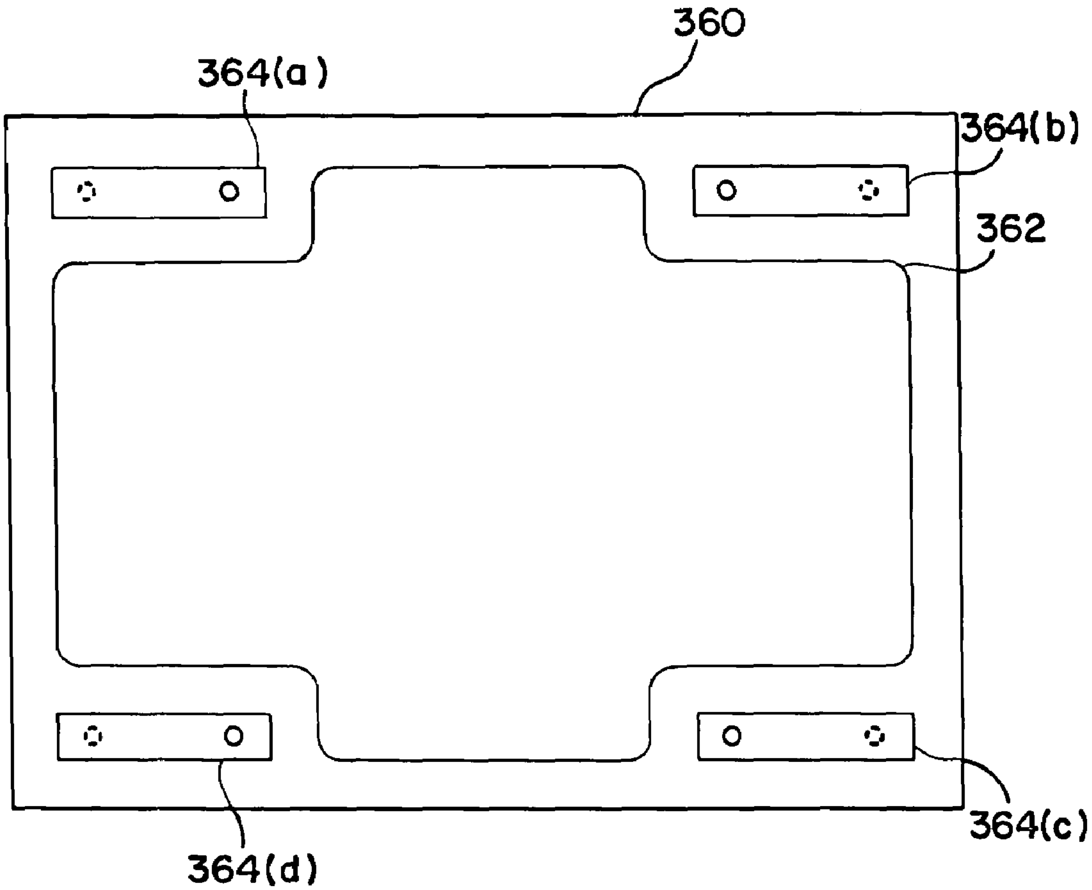
FIG. 36 illustrates an alternative integral MEM device enclosure fabricated according to one aspect of the present invention.

FIG. 36 illustrates yet another alternative arrangement for a top enclosure 360 of an encapsulated MEM device, such as the top enclosure illustrated in FIGS. 33 and 34. For example, the MEM encapsulating structure provided in FIGS. 33 and 34 may be further modified to include a fabrication layer 362. This additional fabrication layer 362 may be deposited along the top surface of the enclosure and may be deposited along with layer 354 in FIG. 35 or could be a separate layer. In one preferred arrangement, this top material includes Aluminum, Copper, or other like metal. The top enclosure 360 also includes a plurality of tortuous paths 364(*a*), (*b*), (*c*), and (*d*).

In one arrangement, this additional fabrication layer 362 could be an electromagnetic shield shielding electromagnetic radiation (such as RF, infra red, etc. radiation). Providing such an electromagnetic shield has certain advantages. For example, where the underlying MEM device is an RF switch, providing an RF shield would confine the RF signal in close proximity to the switching area of the MEM device. This would tend to limit propagation of the signal to interfere with other signal lines or adjacent MEM devices or other electronic devices. Alternatively, this additional fabrication layer 362 could be a pull-back contact. Where this layer 362 is used as a pull-back contact, such a contact would operate in a similar manner as the pull-back contact 28 illustrated in FIG. 2.

A second preferred fabrication method for fabricating a MEM device involves the MEM device fabricating process 400 illustrated in FIG. 37. This process 400 is generally directed to a process for fabricating a MEM device comprising an abrasion resistive contact. More particularly, this process 400 is generally directed to a process for fabricating a MEM relay comprising an abrasion resistive contact wherein the resistive contact is deposited along an underside of a two arm ribbed lever mechanism.

Referring now to the alternative fabrication process 400 illustrated in FIG. 37, at Step 402 a substrate is provided. The substrates are generally identical to the substrates provided in process 30 illustrated in FIG. 3. Where the MEM device is used for microwave applications, a ceramic substrate may be appropriate such as alumina.

Figure 38:
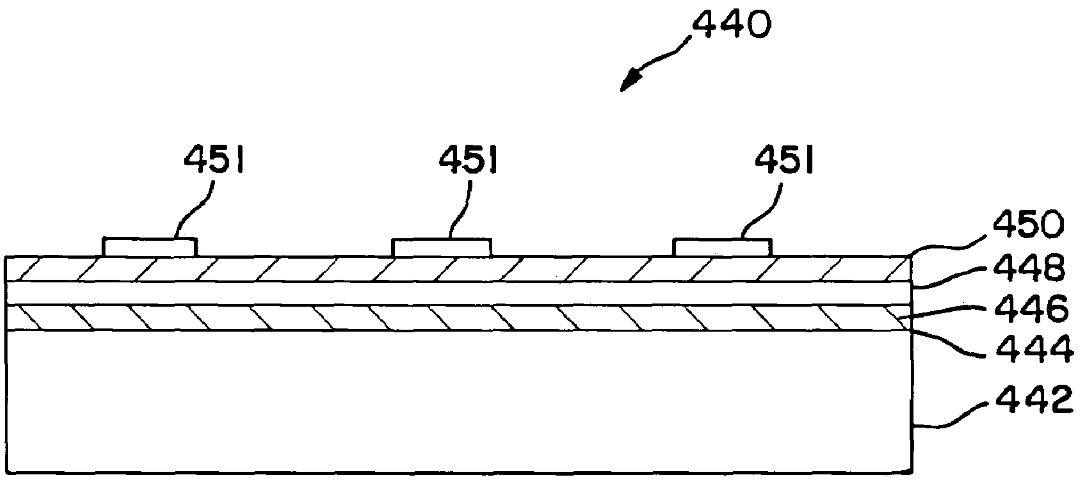
FIGS. 38, 39(*a*), 39(*b*), 40-43, 44(*a*), 44(*b*), and 45-50 illustrate various processing steps for fabricating a MEM relay device with abrasion resistant contacts.

FIG. 38 illustrates a substrate structure processed in accordance with an initial processing step of process 400 and incorporates aspects of the present invention.

As shown in FIG. 38, a substrate structure 440 includes an insulator 442. Along a top surface 444 of insulator 442, an adhesion layer 446 is deposited. Adhesion layer 446 may be utilized where increased adhesion properties are required between a metallic layer and an insulator, such as insulator 442. For example, where certain insulator substrates are selected, the substrate and metallic composition adhesion characteristics may need to be enhanced. In one exemplary arrangement, the adhesion layer 446 comprises a 200 Angstrom layer of Ta, TaN, TiW or Cr. Such an adhesion layer may be applied by either sputtering or electron-beaming.

After the adhesion layer 446 has been defined, a metallic stripline layer 448 is provided. Such a stripline layer 448 could comprise copper, copper coated with gold, or a gold plated substrate. Copper may be a preferred stripline layer material because of copper's excellent conductive properties.

As a next processing step, it might be desirable to coat the top surface of the stripline layer 448 with an appropriate contact material 450. Providing such a contact material may result in certain advantages. For example, providing such a contact material may improve certain reliability aspects of the MEM device such as increasing device reliability while also reducing contact surface hot spots.

Contact material 450 may comprise TaN, conductive nanocrystalline diamond, or another suitable type of switching material. The contact material 450 can be provided so as to improve contact performance by minimizing stiction, minimizing abrasion, while also reducing device and/or contact degradation due to local high current density regions. This material may also comprise carbon nanotubes dispersed in an appropriate matrix. Providing the adhesion layer, the stripline layer, and the contact material is illustrated as Step 404 in FIG. 37.

Figure 39A:
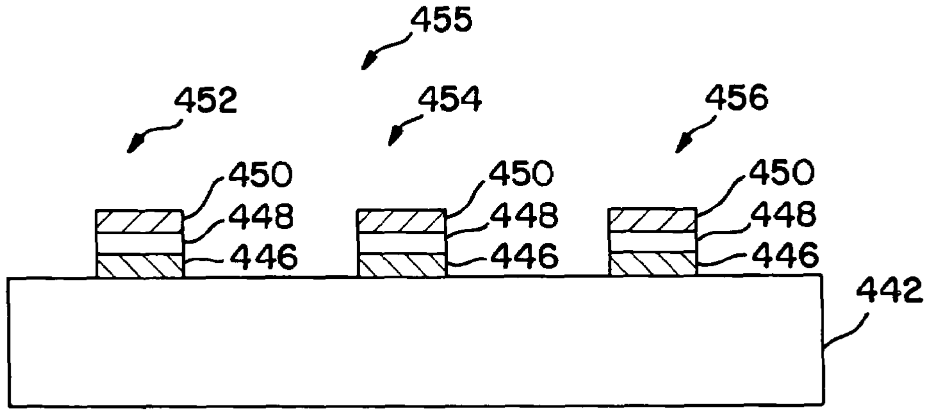
Figure 39B:
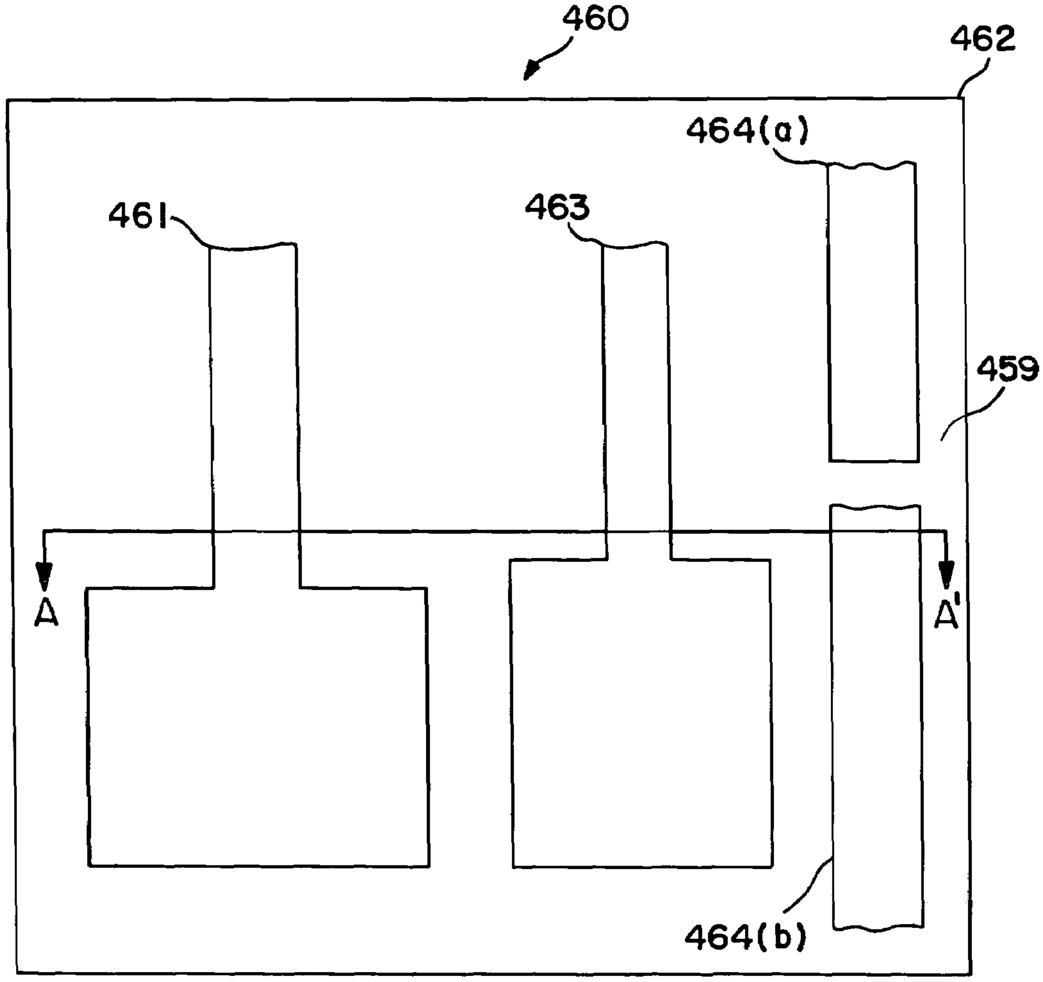

As shown in FIG. 37, after Step 404, the next processing Step 406 includes providing a photoresist layer, photoshaping the photoresist, and then etching. FIG. 39(*a*) illustrates a substrate structure 455 after this etching step. As can be seen from FIG. 39(*a*), the substrate structure 455 includes a first contact area 456, a second contact area 454, and a third contact area 452. Each of these contact areas 456, 454, and 452 comprise three layers: an adhesion layer 446, a metallic layer 448, and a contact material layer 450.

FIG. 39(*a*) is a side view taken along the A-A' axis of FIG. 39(*b*). As illustrated in FIG. 39(*b*), the substrate structure includes a first contact region 459, a second contact region 463, and a third contact region 461. The first contact region 459 defines both an RF input contact 464(*a*) and an RF output contact 464(*b*). As will be described in detail below, a preferred MEM device is fabricated to include a contact material disposed along a bottom surface of a lever mechanism portion. Providing such a contact material results in certain operational advantages such as increasing the operational life of the contacts.

In the arrangement illustrated in FIG. 38, the photoresist 451 has been masked and photoshaped so that the etching step defines three contact zones 452, 454, and 456 (FIG. 39(*a*)). However, as those of skill in the art will recognize, alternative contact zone arrangements may also be used. For example, one such alternative arrangement could include locating one of the contact zones on a top portion of a MEM enclosure. In one arrangement, each contact region 452, 454, and 456 has a width of approximately 15 to 100 microns.

Once the substrate structure has been etched, the next step in the process 400 of FIG. 37 is Step 408. Step 408 comprises providing a first sacrificial layer to the substrate structure. Such a first sacrificial layer could comprise aluminum. After this first sacrificial layer is provided, a second sacrificial layer is deposited over the first sacrificial layer. The process of providing the first and the second sacrificial layer is illustrated in FIG. 40.

Figure 40:
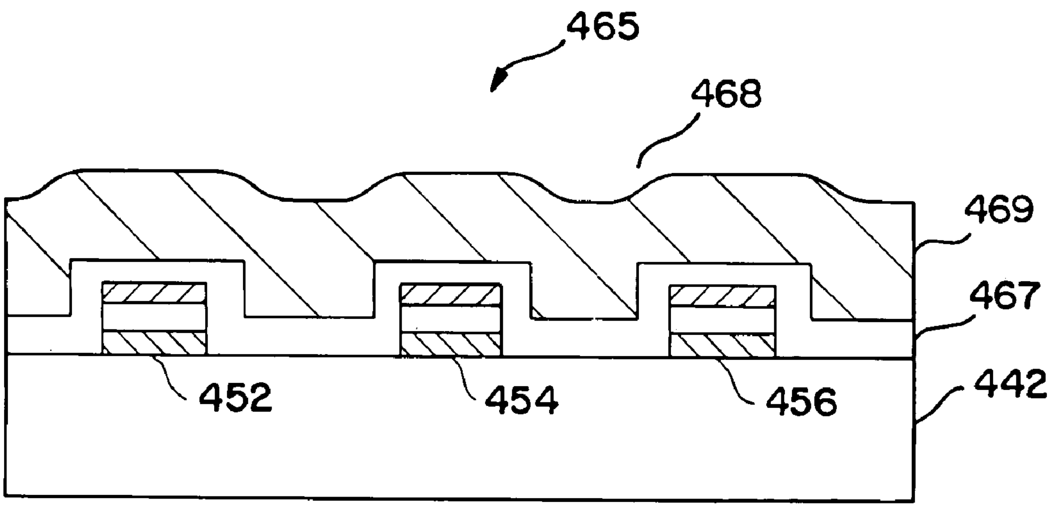

FIG. 40 illustrates a substrate structure 465 having a first sacrificial layer 467 and a second sacrificial layer 469. Preferably this first sacrificial layer 467 is aluminum. The first sacrificial layer 467 may be deposited by sputtering or e-beam evaporation. As will be described in greater detail below, this first sacrificial layer protects the contact regions 452, 454, and 456 from further processing during subsequent MEM device processing steps. For instance, it would protect copper from oxidation if the second sacrificial layer 469 was $SiO_2$.

The second sacrificial layer 469 may comprise $SiO_2$. As can be seen from FIG. 40, the top surface 468 of the second sacrificial layer 469 has a non-planar shape. Consequently, to simplify certain subsequent processing steps, the top surface of the second sacrificial layer 469 is planarized. Such a planarizing processing step, represented as Step 410 in process 400 of FIG. 37, may occur by way of CMP.

Figure 41:
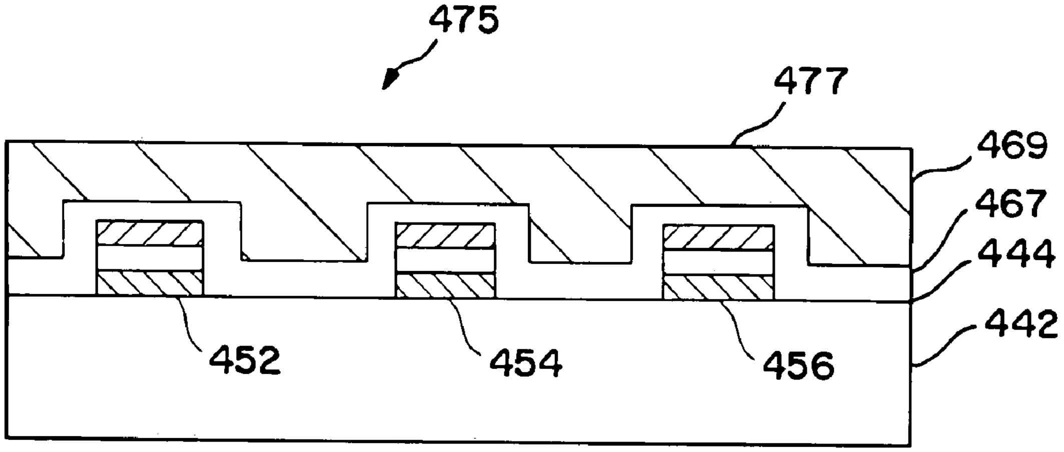

After the planarization process occurs at Step 410, the resulting substrate structure 475 will have a planarized substrate surface. Such a planarized substrate surface is illustrated in FIG. 41. As can be seen from FIG. 41, a substrate structure 475 is provided wherein the second sacrificial layer 469 comprises a planarized top surface 477.

Returning now to the processing steps of FIG. 37, the planarization processing Step 410 occurs after the addition of the second sacrificial layer at processing Step 408. In this manner, the planarizing process step removes excess sacrificial layer material residing on the substrate surface.

After completing the planarization Step 410 in FIG. 37, a recess will be defined along the top surface 477 of the second sacrificial layer 469. An initial step in defining the recess is established by first providing a photoresist layer at Step 412 along the top surface of the second sacrificial layer. The photoresist layer is then photoshaped so as to define a recess along the top surface of the second sacrificial layer and generally above the contact zone.

Figure 42:
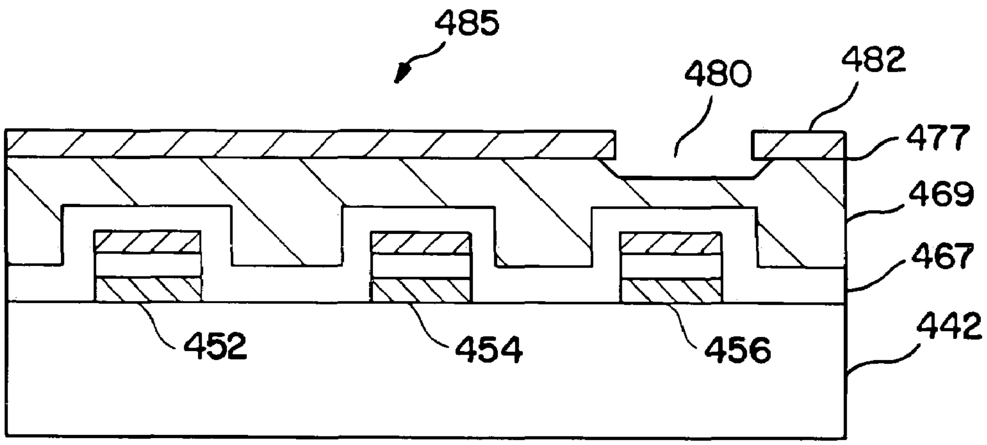

FIG. 42 illustrates the substrate structure 485 including the photoresist layer 482 after the substrate structure 485 of FIG. 42 has been etched. As can be seen in FIG. 42, etching the substrate structure results in a substrate structure 485 having a recess 480. Preferably, the photoresist 482 is shaped so that the resulting recess 480 is defined to reside above the third contact zone 456. Preferably, the recess 480 is formed so that it has a depth of approximately 0.5-2.0 μm and extends to a width of several microns extending past the third contact zone 456 and extends to applicably compensate for certain process variabilities (e.g., several microns). Then, at Step 413 in FIG. 37, the photoresist layer 482 is removed.

Figure 43:
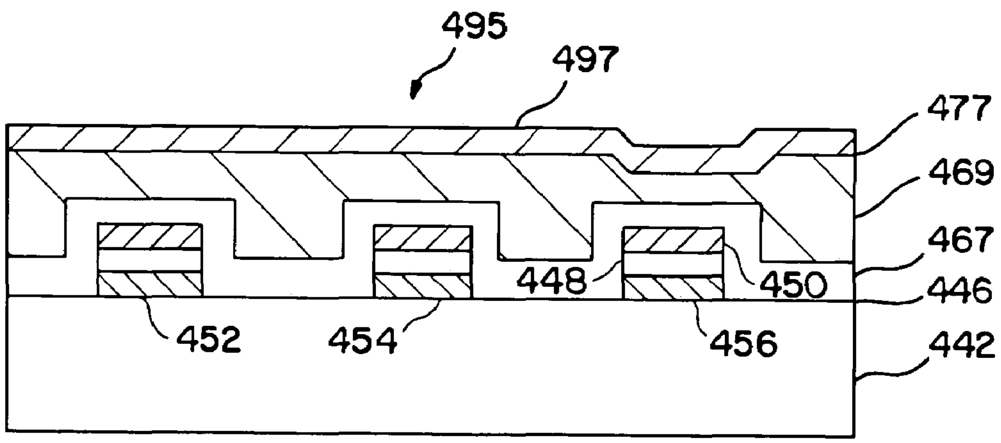

FIG. 43 illustrates another processing step for fabricating a MEM device. FIG. 43 includes a substrate structure 495 comprising a substrate contact material layer 497. A contact material layer 497 is deposited along the generally planar top surface 477 of the second sacrificial layer 469. Preferably, this contact material layer 497 comprises conductive diamond deposited by chemical means. Alternatively, this contact material layer 497 comprises a diamond layer expressed in a polymer matrix, TaN, or other suitable abrasion resistive material. More preferably, layer 497 comprises a contact material similar to the contact material 450 deposited on the top portion of the third contact zone 456. In other words, the contact material used in layer 497 is preferably similar to the contact material used for contact areas 452, 454, and 456.

Figure 44A:
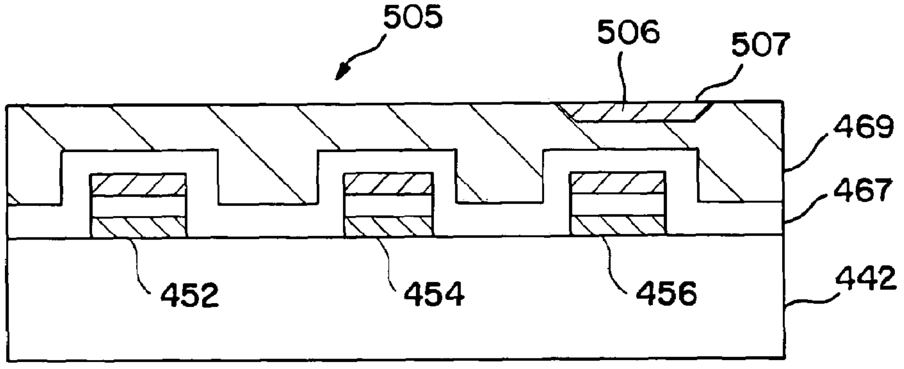
Figure 44B:
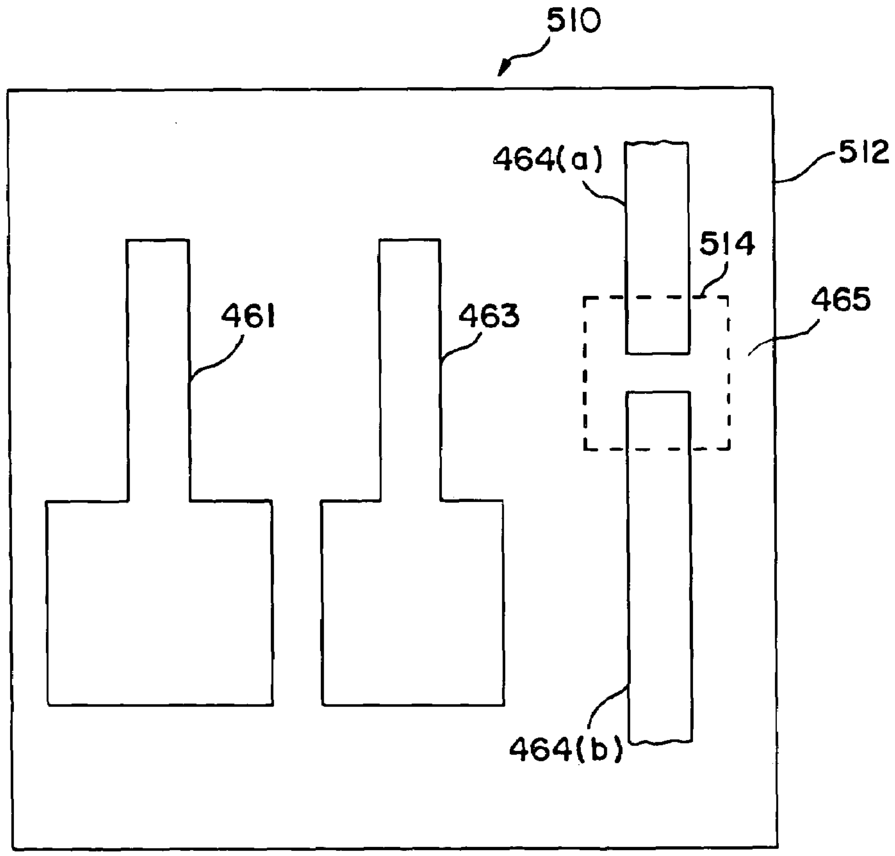

As a next process step, Step 416 in FIG. 37, the contact material layer 497 is planarized. Preferably, this contact layer is planarized via CMP but as will be recognized by those skilled in the art, other planarization methods may also be used. FIG. 44(*a*) illustrates the substrate structure after the planarization of the contact material layer. As can be seen from FIG. 44(*a*), the recess is now filled with a contact material 506 that resides above the third contact zone area 456. FIG. 44(*b*) provides a top view of the substrate structure 510 illustrated in FIG. 44(*a*). In FIG. 44(*b*), a substrate structure 510 is provided wherein the contact material 514 defines a recessed area filled with contact material 514. Contact material 514 resides over the RF contact region 465 defined by both the RF input and the RF output contacts 464(*a*) and (*b*). More particularly, the contact area 514 resides over a portion of both the RF input contacts 464(*a*) and the RF output contact zone 464(*b*).

Figure 45:
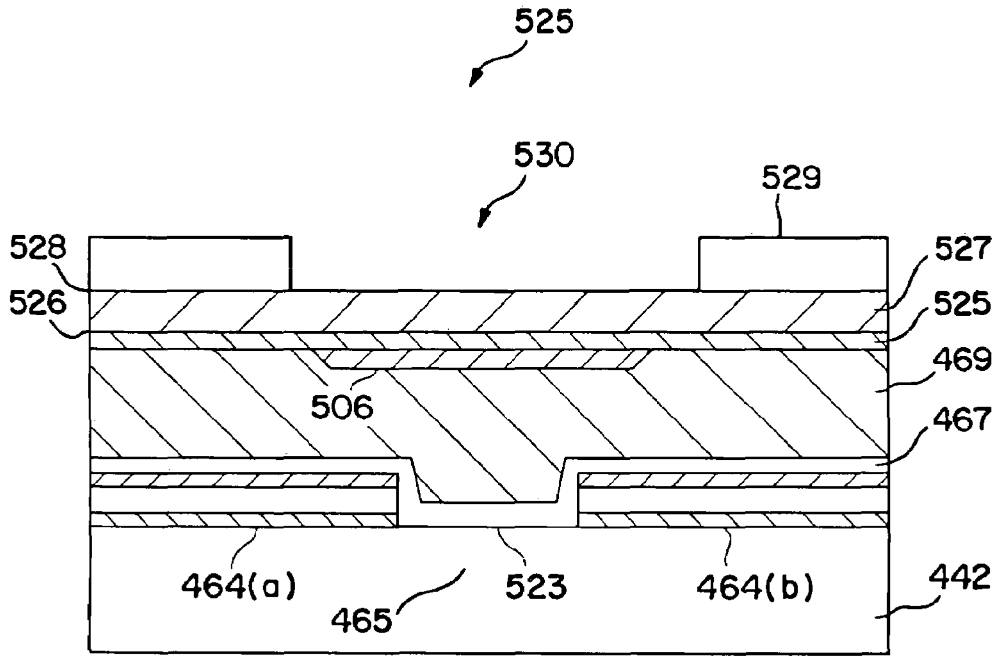

Returning to the flow chart 400 illustrated in FIG. 37 and the substrate structure 525 illustrated in FIG. 45, in a next processing step, an etch stop layer 525 is provided at Step 418. This etch stop layer 525 is provided along the top surface of the second sacrificial layer 469 and also along the top surface of the contact material area 506. Preferably, this etch stop layer 525 is Aluminum and is deposited to a height of approximately 0.1 micrometer.

At a next processing Step 420 (FIG. 37), another sacrificial layer 527 is provided along a top surface 526 of the metallic layer 525. Preferably, this layer comprises $SiO_2$ and is deposited at a height of approximately 1 to 4 microns. FIG. 45 also illustrates the RF contact region 465 comprising both RF contacts 464(*a*) and 464(*b*) (see also FIGS. 44(*a*) and (*b*)). The RF contacts 464(*a*) and (*b*) are separated by an RF contact gap 523.

Returning now to FIG. 45, after the sacrificial layer 527 is provided, a photoresist layer 529 is deposited and photoshaped along the top surface 528 of the sacrificial layer 527. Preferably, this photoresist layer 529 is photoshaped to define a photoresist void 530. This photoresist void extends by several microns over the previously deposited and planarized contact material 506. The layer 527 is then etched. This etching step removes layer 527 down to layer 525. Another etching step is performed to remove 525 where not protected by 529. The resulting substrate structure, after photoresist removal which is structure 535, is illustrated in FIG. 46.

Figure 46:
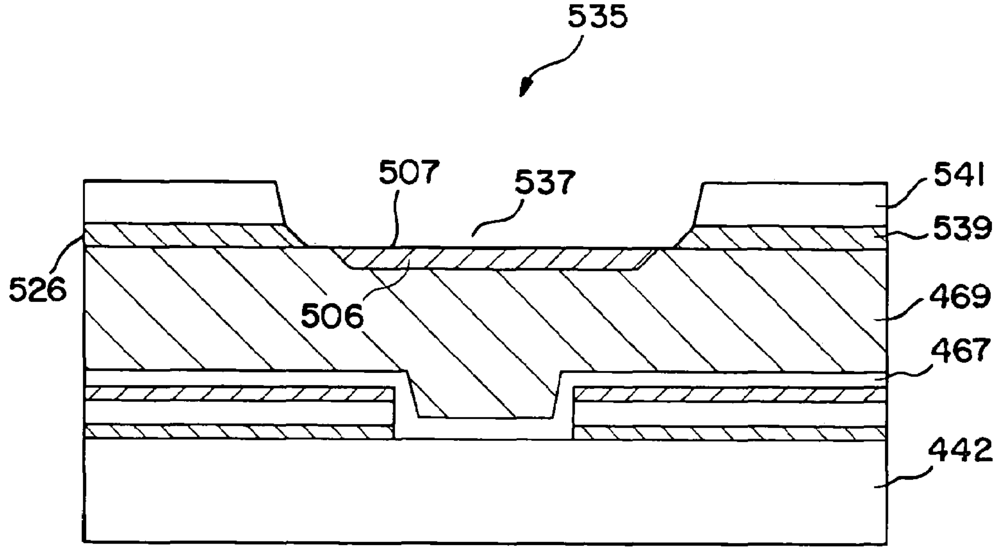

As shown in FIG. 46, this etching step defines an enlarged cavity 537. This enlarged cavity 537 extends through the sacrificial layer 541 and through the metallic layer 539 to a top surface 507 of previously deposited and planarized contact material 506. This enlarged cavity 537 helps define a ribbed lever mechanism in the processing steps described below.

Next, at Step 423 and similar to the process described in FIG. 3 and other related figures, the anchor portions are formed. This step comprises the depositing, baking, masking, and exposure of a photoresists layer and etching the two anchor cavities down to the substrate through the sacrificial layers.

Figure 47:
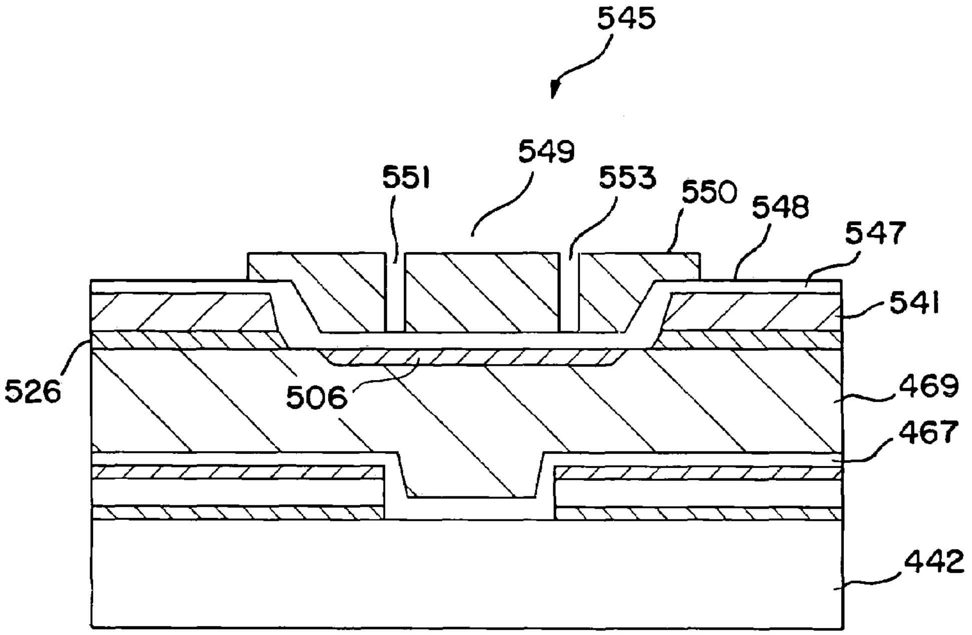

FIG. 47 illustrates an additional processing step for fabricating a preferred MEM device. This processing step is represented as Step 424 in FIG. 37. In Step 424, and referring to FIG. 47, an insulating layer of $Si_3N_4$, $Al_2O_3$, SiC, or nanocrystalline diamond 547 is deposited along the top surface of the substrate structure 545. Preferably, this layer 547 is provided at a depth of approximately 1 to 4 micrometers.

Next, and as illustrated at Step 426 of FIG. 37, along the top surface of the substrate structure illustrated in FIG. 47, a photoresist layer 549 is provided. Preferably, this photoresist layer 549 is photoshaped so as to essentially cover the enlarged cavity 537 and photoshaped so as to define at least one aperture. More preferably, this photoresist layer 549 is photoshaped so as to define both a first and a second aperture 551, 553, respectively. Defining the apertures 551 and 553 ocurrs at Step 426 in FIG. 37. Aperture 551 and 553 extend from a top surface 550 of the photoresist layer 549 to a top surface 548 of the layer 547. The first and the second apertures 551, 553 are illustrated in FIG. 47. The substrate structure 545 is then etched at Step 426 to form the outline of the lever mechanism in material 547 and to etch apertures into this mechanism.

Figure 48:
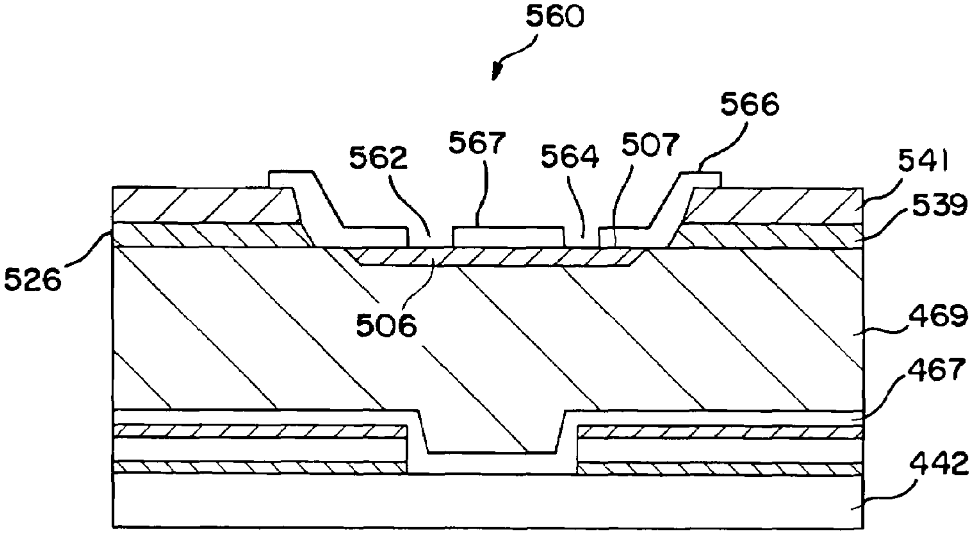

FIG. 48 illustrates a substrate structure 560. Substrate structure 560 illustrates a resulting structure after the structure 545 illustrated in FIG. 47 has been etched and the photoresist layer 549 removed. As illustrated in FIG. 48, the substrate structure 560 includes a layer 566 residing essentially over the contact material 506. This layer 566 now includes two etched apertures 562, and 564. Both etched apertures 562, 564 extend from a top surface 567 of the layer 566 to a top surface 507 of the contact area 506. Etching and defining apertures 562 and 564 is represented by Step 426 in the flowchart illustrated in FIG. 37. As those of skill in the art will recognize, alternate etched apertures arrangements may be utilized, such as, for example, an etched apertures arrangement comprising more than two apertures.

Figure 49:
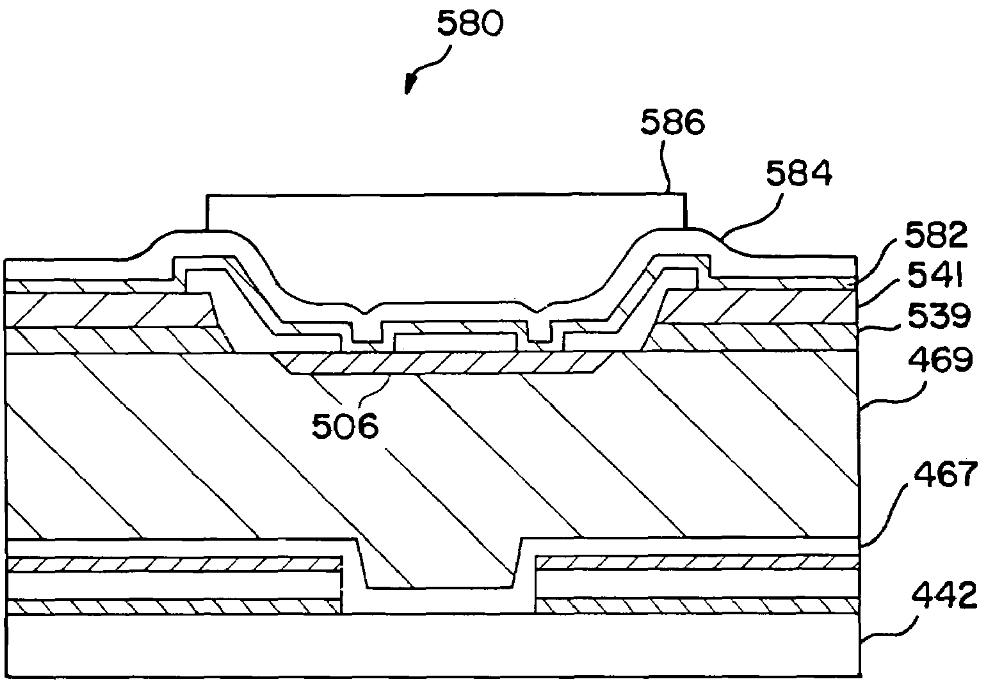

FIG. 49 illustrates yet another substrate structure after the apertures 562 and 564 have been etched and the outline of the lever mechanism has been etched at Step 426 and includes additional processing steps.

FIG. 49 illustrates a substrate structure wherein these processing steps are used. As shown in FIG. 49, the substrate structure 580 includes an adhesion layer 582 deposited over the surface of the substrate structure 580. This adhesion layer may comprise Ta or other like materials such as TiN, chrome, etc. One reason for providing adhesion layer 582 is to increase certain adhesion qualities of a metal layer to the MEM device. After this adhesion layer 582 is deposited, a metallic layer 584 such as copper is provided (Steps 430 and 432 in FIG. 37).

Importantly, during the adhesion layer and metallic layer depositing, these process steps allow for the adhesion layer material and to a certain extent the metallic material, to propagate through the etched apertures and to thereby come into contact with contact material 506. By having the adhesion material and the metallic material join with the contact material 506, certain operating advantages are realized. For example, this type of channeling or riveting action increases the adhesion of the contact material to the MEM device lever mechanism.

At a next processing step, Step 434, the substrate structure 580 is provided with a photoresist layer 586. This layer 586 is then photoshaped over the contact material area 506 as illustrated in FIG. 49. The substrate structure 580 is then etched. After this etching step and removal of the photoresist, the substrate structure resembles the structure illustrated in FIG. 50.

Figure 50:
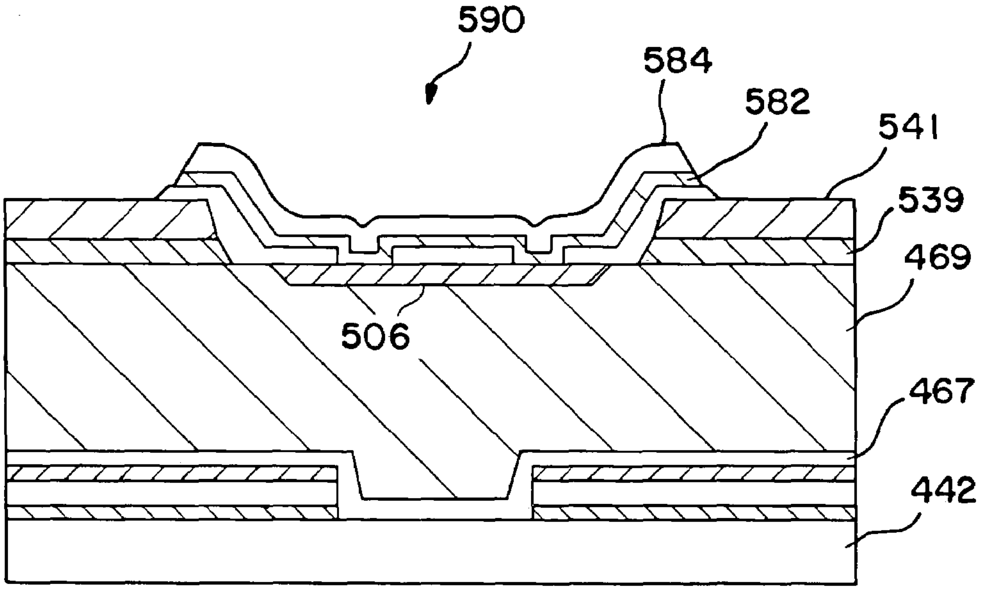

FIG. 50 illustrates a substrate structure 590 wherein the etched adhesion layer 582 is shown as residing only over a portion of the substrate surface. Preferably, this etched adhesion layer 582 resides over the material layer 506 and extends into both of the cavities, thereby contacting with the material layer 506. In addition, the etched metallic layer 584 is shown as residing over the etched adhesion layer 582. As can be seen from FIG. 51, this lever mechanism defines a ribbed shape. Providing such a ribbed shaped lever mechanism provides certain operational and structural advantages as previously described.

After etching the photoresist and removing the photoresist 586 from the substrate 580 in FIG. 49, this substrate structure is then ready for release etching. This release etching step may be accomplished by using buffered HF for the silicon dioxide and an aluminum etchant such as phosphoric acid for the removal of the aluminum. The buffered HF might also be sufficient to remove the aluminum. The resulting substrate structure is illustrated in FIGS. 51 and 52.

Figure 51:
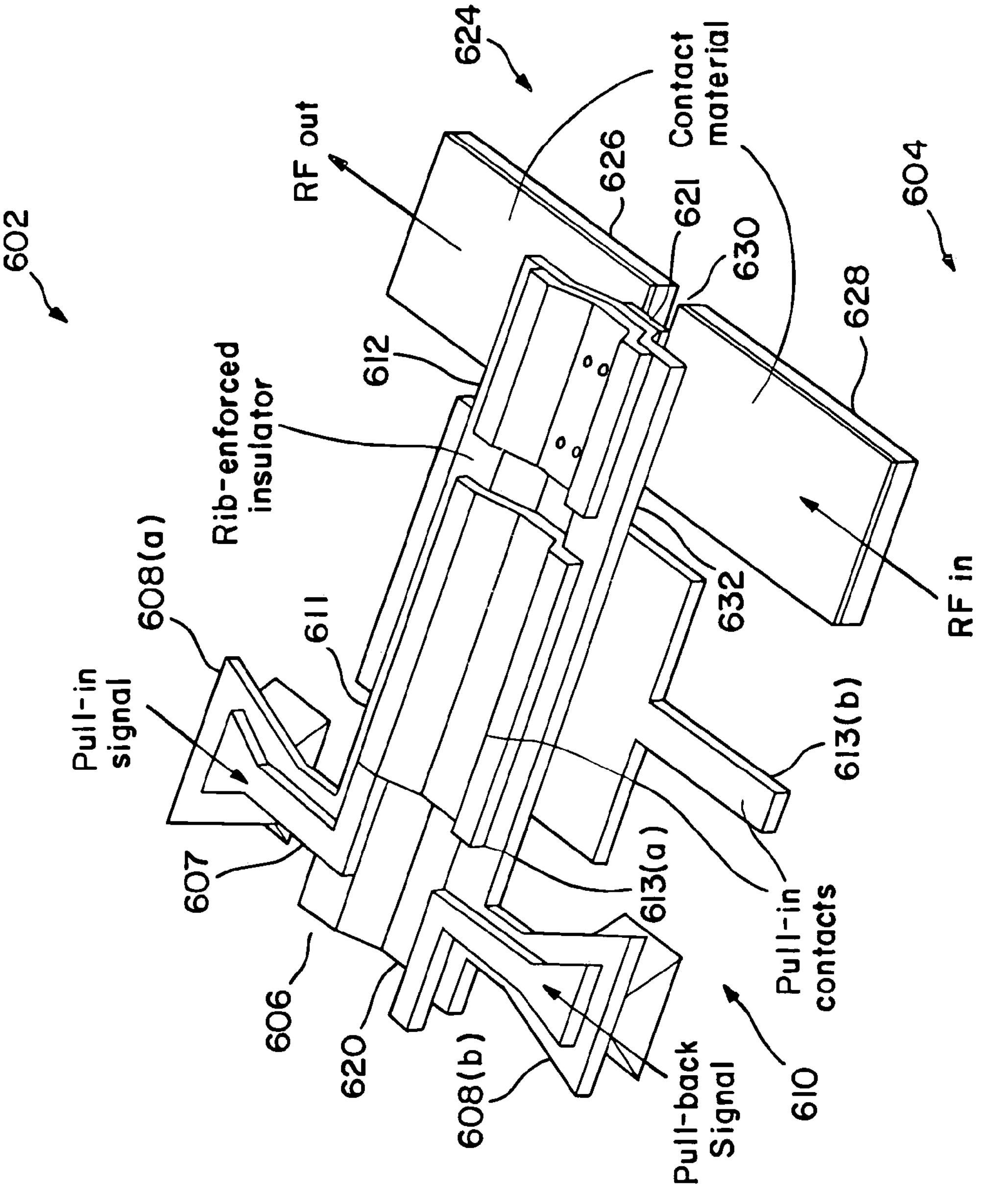
FIG. 51 illustrates a perspective view of a MEM device fabricated in accordance with the process 400 illustrated in FIG. 37.
Figure 52:
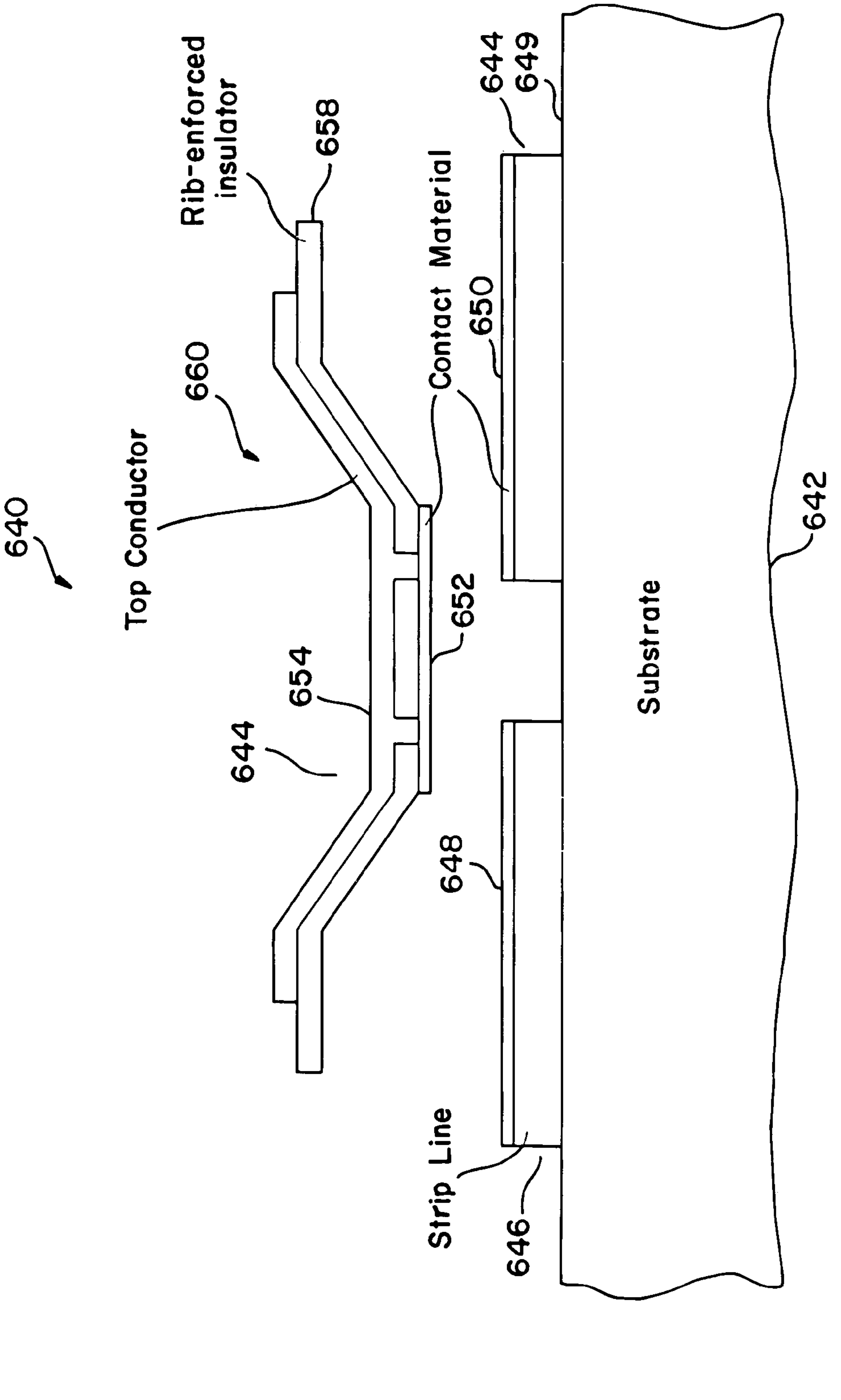
FIG. 52 provides a profile view of an alternative embodiment comprising a mechanical lever that includes a rib.

FIG. 51 illustrates a partial perspective view of a MEM device fabricated in accordance with the process 400 illustrated in FIG. 37 and discussed with reference to FIGS. 38-50. FIG. 51 illustrates a MEM device 602 that resides along a surface of a substrate 604. MEM device 602 comprises a two arm lever mechanism 606. This lever mechanism comprises pull-in signal contact areas 613(*a*) and 613(*b*), pull-back signal contact areas to the left of the lever (not shown in FIG. 51 but see FIG. 44(*b*)), and an RF contact area 624. The lever mechanism also includes a first anchor portion 608(*a*) and a second anchor portion 608(*b*). Both of these anchor portions 608(*a*) and (*b*) are positioned along a top surface 610 of a substrate 604 and anchored to this substrate 604. Apart from the anchor portions 608(*a*) and (*b*), the two arm lever mechanism extends along the surface of substrate 604 over certain contact regions. Preferably, the two arm lever mechanism comprises a first extending portion 611 and a second extending portion 612. Both of these portions extend away from the anchor portions 608(*a*) and (*b*) while also residing over the surface 610 of the substrate 604. More specifically, in this arrangement, the first extending portion 611 resides over the pull-in contact region 613(*b*) and the second extending portion extend portion 612 resides over an RF contact region 624. More specifically, first extending portion 611 extends over contact region 613(*b*) and second extending portion 612.

As can be seen from this perspective view given in FIG. 51, the two arm lever mechanism does not have a topography of the illustrated MEM CMOS device 10 illustrated in FIG. 1. As described in further detail above, the lever mechanism 606 also has a bottom surface 632. Bottom surface 632 is preferably not uni-planar but rather contains a structure that tends to increase lever mechanism rigidity. For example, in one arrangement, the lever mechanism 606 is provided with a contoured surface such as a ribbed surface 620. In such an arrangement, the contoured surface comprises an insulating layer extending a length of the lever mechanism 606.

The pull-in contact region functions by applying an electric field between the pull-in contact 613(*a*) on top of the lever mechanism and the pull-in contact 613(*b*) residing along the surface 610 of the substrate 604 to drive the lever structure and the contact region 624 together.

The contact region 624 comprises two micro-strip lines 626 and 628 wherein these strip lines are separated by a gap 630. This gap resides under the lever mechanism 606 and is partially shown in FIG. 51. This MEM device can operate as a relay when the gap between the strip lines is shorted. Preferably, where the lever mechanism 606 comprises an abrasion resistive material such as diamond, the MEM device is operated when the ribbed portion 620 of the lever mechanism 606 is pulled-in so that the ribbed portion 621 connects or shorts the 626 and 628 strip lines.

FIG. 52 provides a profile view 640 of a mechanical lever 660 that includes a rib 644. In FIG. 52, mechanical lever 660 comprises a top conductor 654, a rib enforced insulator 658, and a contact material 652. (Not shown is an adhesion layer 582 illustrated in FIG. 50). As shown, the mechanical lever resides over a surface 649 of substrate 642. When the MEM device 602 operates as a relay, the lever mechanism 660 is energized via pull in contact (such as pull-in contacts 613(*a*) and (*b*) illustrated FIG. 51), so that the contact material 652 of the mechanical lever 660 is operatively coupled to the contact material disposed along both the first strip line 644 and the second strip line 646. By using such contact material on both the lever mechanism 660 and the strip lines 648 and 650, the MEM relay results in a number of advantages such as those advantages described above. It might also be possible to include the abrasion resistive material on only one contact surface, such as on the movable member 660 or on the stationary strip lines.

Once the MEM device has been fabricated in accordance with the process steps identified in FIG. 37, the MEM device may be encapsulated. The MEM device illustrated in FIGS. 51 and 52 may be encapsulated in a similar manner as described in detail above with reference to the process 180 of FIG. 18 and described with respect to FIGS. 19 through 36.

Exemplary embodiments of the present invention have been described. Those skilled in the art will understand, however, that changes and modifications may be made to these embodiments without departing from the true scope and spirit of the present invention, which is defined by the claims.

I claim:

1. A micro-machined structure for enclosing at least one MEM device, said structure comprising:

a structure extending from a substrate and at least partially enclosing said at least one MEM device; and a cover structure residing on a portion of said substrate structure, a contact region, said contact region provided on said cover substrate structure, said contact region acting as a pull-back contact for a MEM device residing on said substrate;

wherein said micro-machined structure defines at least one tortuous path, wherein said tortuous path provides for a removal of material residing along said substrate structure.

2. The invention of claim 1 wherein said contact region comprises a shielding member, said shielding member preventing passage of electromagnetic radiation.

3. The invention of claim 1 further comprising a sealing member, said sealing member engaging said tortuous path such that said sealing member seals said enclosure.

4. The invention of claim 3 further comprising a gaseous material provided in said sealed enclosure.

5. The invention of claim 4 wherein said gaseous material comprises an inert gas.

6. The invention of claim 4 wherein said gaseous material comprises an arc preventing gaseous material.

7. The invention of claim 3 wherein said sealing member seals said enclosure in a vacuum sealed state.

8. The invention of claim 1 wherein said tortuous path defines a labyrinth path.

9. The invention of claim 1 further comprising a second MEM device, said second MEM device enclosed by said micro-machined structure.

10. The invention of claim 1 wherein said micro-machined apparatus is an integral micro-machined structure.

11. The invention of claim 1 wherein said micro-machined structure for enclosing at least one MEM device comprises diamond.

* * * * *